(12) United States Patent
Schweikert et al.

(10) Patent No.: US 9,741,591 B2
(45) Date of Patent: Aug. 22, 2017

(54) WAFER LEVEL PACKAGING OF MICROBOLOMETER VACUUM PACKAGE ASSEMBLIES

(71) Applicant: FLIR Systems, Inc., Wilsonville, OR (US)

(72) Inventors: Paul Schweikert, Ventura, CA (US);
Andrew Sharpe, Solvang, CA (US);
Gregory A. Carlson, Goleta, CA (US);
Alex Matson, Goleta, CA (US); Scott Vilander, Santa Barbara, CA (US); Bob Zahuta, Santa Barbara, CA (US);
Richard M. Goeden, Goleta, CA (US)

(73) Assignee: FLIR Systems, Inc., Wilsonville, OR (US)

(*) Notice: Subject to any disclaimer, the term of this patent is extended or adjusted under 35 U.S.C. 154(b) by 0 days.

(21) Appl. No.: 14/141,300

(22) Filed: Dec. 26, 2013

(65) Prior Publication Data

US 2014/0186999 A1  Jul. 3, 2014

Related U.S. Application Data

(60) Provisional application No. 61/801,596, filed on Mar. 15, 2013, provisional application No. 61/747,867, filed on Dec. 31, 2012.

(51) Int. Cl.
*H01L 21/50* (2006.01)
*H01L 21/67* (2006.01)
(Continued)

(52) U.S. Cl.
CPC .......... *H01L 21/50* (2013.01); *B81C 1/00269* (2013.01); *H01L 21/6719* (2013.01);
(Continued)

(58) Field of Classification Search
CPC ..... H01L 21/6831; H01L 24/94; H01L 21/50; H01L 21/67098; H01L 21/67109;
(Continued)

(56) References Cited

U.S. PATENT DOCUMENTS 4,127,431 A   11/1978   Susnjara
4,420,352 A   12/1983   Schroeder et al.
(Continued)

FOREIGN PATENT DOCUMENTS

EP   1816454      8/2007
JP   2007201196   8/2007
JP   2010040644   2/2010

OTHER PUBLICATIONS

Mawer, Andrew, "Plastic Ball Grid Array (PBGA)", Motorola Semiconductor Technical Data, 1996, AN1231/D, pp. 1-28.
(Continued)

*Primary Examiner* — Mary Wilczewski
(74) *Attorney, Agent, or Firm* — Haynes and Boone, LLP

(57) ABSTRACT

An apparatus for the wafer level packaging (WLP) of micro-bolometer vacuum package assemblies (VPAs), in one embodiment, includes a wafer alignment and bonding chamber, a bolometer wafer chuck and a lid wafer chuck disposed within the chamber in vertically facing opposition to each other, means for creating a first ultra-high vacuum (UHV) environment within the chamber, means for heating and cooling the bolometer wafer chuck and the lid wafer chuck independently of each other, means for moving the lid wafer chuck in the vertical direction and relative to the bolometer wafer chuck, means for moving the bolometer wafer chuck translationally in two orthogonal directions in a horizontal plane and rotationally about a vertical axis normal to the horizontal plane, and means for aligning a fiducial on a bolometer wafer held by the bolometer wafer
(Continued)

chuck with a fiducial on a lid wafer held by the lid wafer chuck.

10 Claims, 35 Drawing Sheets

(51) Int. Cl.
    *H01L 21/677*     (2006.01)
    *H01L 21/68*     (2006.01)
    *H01L 21/683*     (2006.01)
    *H01L 31/09*     (2006.01)
    *H01L 31/0203*     (2014.01)
    *B81C 1/00*     (2006.01)
    *H01L 23/00*     (2006.01)

(52) U.S. Cl.
    CPC .. *H01L 21/67109* (2013.01); *H01L 21/67207* (2013.01); *H01L 21/67745* (2013.01); *H01L 21/67748* (2013.01); *H01L 21/67757* (2013.01); *H01L 21/681* (2013.01); *H01L 21/6831* (2013.01); *H01L 31/0203* (2013.01); *H01L 31/09* (2013.01); *B81C 2203/0118* (2013.01); *H01L 24/94* (2013.01); *H01L 2924/12042* (2013.01); *H01L 2924/1461* (2013.01); *H01L 2924/16235* (2013.01); *Y10T 29/41* (2015.01)

(58) Field of Classification Search
    CPC ........... H01L 21/6719; H01L 21/67207; H01L 21/67745; H01L 31/09; H01L 31/0203; H01L 2924/16235
    USPC .................................................. 438/907, 908
    See application file for complete search history.

(56) References Cited

U.S. PATENT DOCUMENTS

| | | | |
|---|---|---|---|
| 4,480,284 A * | 10/1984 | Tojo et al. | 361/234 |
| 5,182,424 A | 1/1993 | Frank | |
| 5,352,926 A | 10/1994 | Andrews | |
| 5,534,697 A | 7/1996 | Creekmore et al. | |
| 5,640,045 A | 6/1997 | Krausse, III | |
| 6,013,134 A * | 1/2000 | Chu et al. | 118/715 |
| 6,028,309 A | 2/2000 | Parrish et al. | |
| 6,262,489 B1 | 7/2001 | Koors et al. | |
| 6,532,796 B1 | 3/2003 | Ikeda | |
| 6,667,543 B1 | 12/2003 | Chow et al. | |
| 7,037,844 B2 | 5/2006 | Dache et al. | |
| 7,402,802 B1 | 7/2008 | Terre et al. | |
| 7,470,904 B1 | 12/2008 | Schweikert et al. | |
| 7,569,926 B2 | 8/2009 | Carlson et al. | |
| 7,709,935 B2 | 5/2010 | Islam et al. | |
| 8,058,104 B2 | 11/2011 | Islam et al. | |
| 8,558,364 B2 | 10/2013 | Summers | |
| 2002/0000646 A1 | 1/2002 | Gooch et al. | |
| 2004/0063251 A1 | 4/2004 | Ootsuka et al. | |
| 2004/0101020 A1 | 5/2004 | Bhandarkar | |
| 2004/0135912 A1 | 7/2004 | Hofflinger et al. | |
| 2006/0196413 A1 | 9/2006 | Sugimura | |
| 2007/0029642 A1 | 2/2007 | Inagawa et al. | |
| 2007/0048887 A1 | 3/2007 | Erlach et al. | |
| 2007/0065984 A1 | 3/2007 | Lau et al. | |
| 2007/0138628 A1 | 6/2007 | Lam | |
| 2008/0048120 A1 | 2/2008 | Gooch | |
| 2008/0245843 A1 | 10/2008 | Suga et al. | |
| 2009/0001537 A1 | 1/2009 | Summers | |
| 2009/0084958 A1 | 4/2009 | Vogt | |
| 2009/0102003 A1 * | 4/2009 | Vogt | B81C 1/00269 257/433 |
| 2009/0140125 A1 | 6/2009 | Takayama | |
| 2009/0251699 A1 | 10/2009 | George | |
| 2009/0294957 A1 | 12/2009 | Lam | |
| 2010/0330776 A1 | 12/2010 | Zuniga et al. | |
| 2011/0049703 A1 | 3/2011 | Hsu et al. | |
| 2011/0089462 A1 | 4/2011 | Van Heerden et al. | |
| 2012/0026337 A1 | 2/2012 | Boulanger et al. | |
| 2012/0097734 A1 | 4/2012 | Diep | |
| 2012/0132522 A1 | 5/2012 | Foster et al. | |
| 2013/0199730 A1 | 8/2013 | Gudeman | |
| 2014/0186999 A1 * | 7/2014 | Schweikert | H01L 21/67109 438/106 |

OTHER PUBLICATIONS

Lapisa et al., "Wafer-Level Heterogeneous Integration for MOEMS, MEMS, and NEMS", IEEE Journal of Selected Topics in Quantum Electronics, vol. 17, No. 3, May/Jun. 2011, pp. 629-644.

Zimmer et al., "One-Megapixel Monocrystalline-Silicon Micromirror Array on CMOS Driving Electronics Manufactured With Very Large-Scale Heterogeneous Integration", Journal of Microelectromechanical Systems, vol. 20, No. 3, Jun. 2011, pp. 564-572.

Niklaus et al., "Performance model for uncooled infrared bolometer arrays and performance predictions of bolometers operating at atmospheric pressure", ScienceDirect, Infrared Physics & Technology, 51, (2008), pp. 168-177.

Lapadatu et al., "Cu—Sn wafer level bonding for vacuum encapsulation of microbolometer focal plane arrays", The Electrochemical Society, Abstract #1693, 218th ECS Meeting, ©2010, 1 page.

Ericsson et al., "Towards 17 um pitch heterogeneously integrated Si/SiGe quantum well bolometer focal plane arrays", Infrared Technology and Applications XXXVII, edited by Bjorn F. Andresen et al., Proc. of SPIE vol. 8012, 801216, © 2011 SPIE, 10 pages.

* cited by examiner

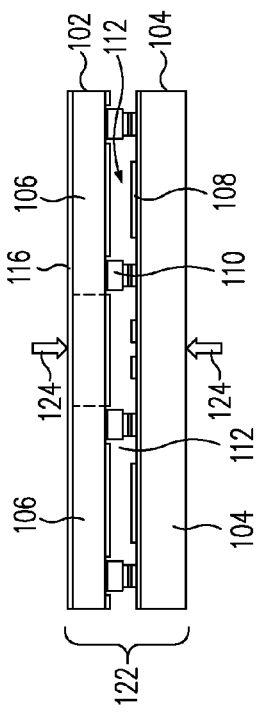
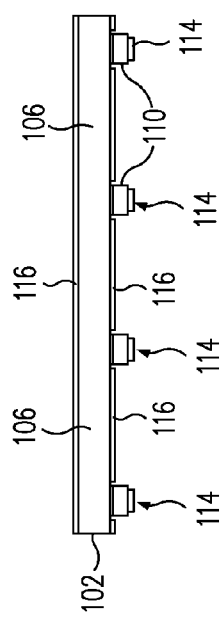
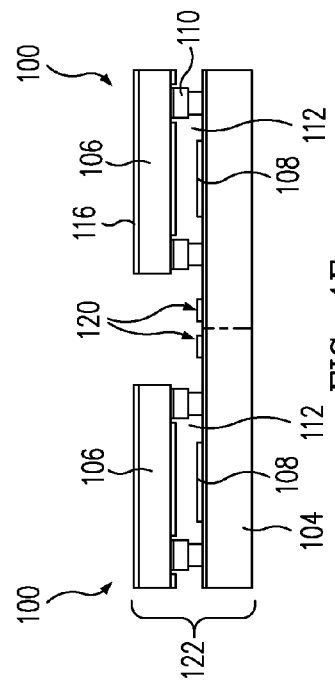
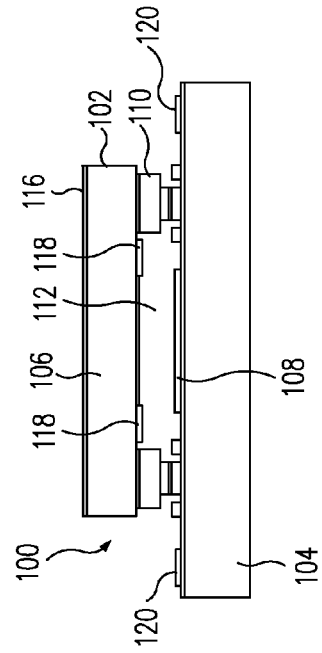
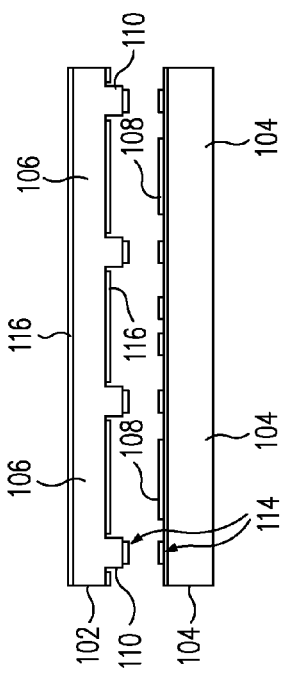
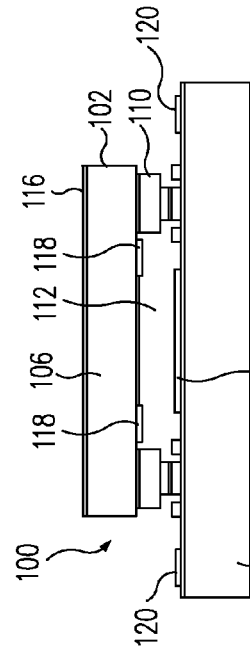

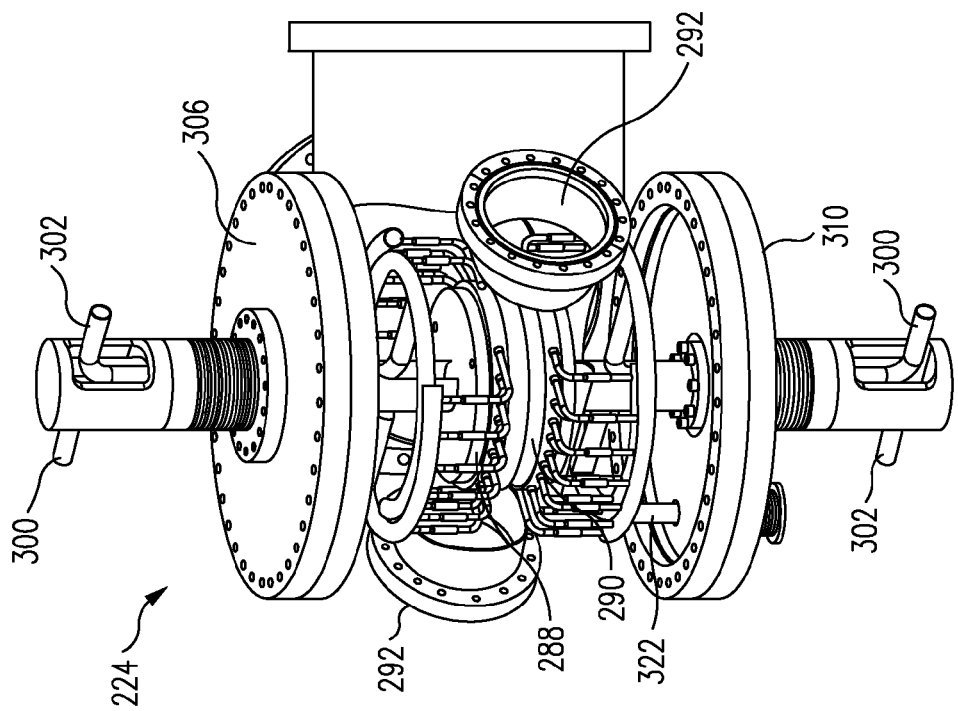
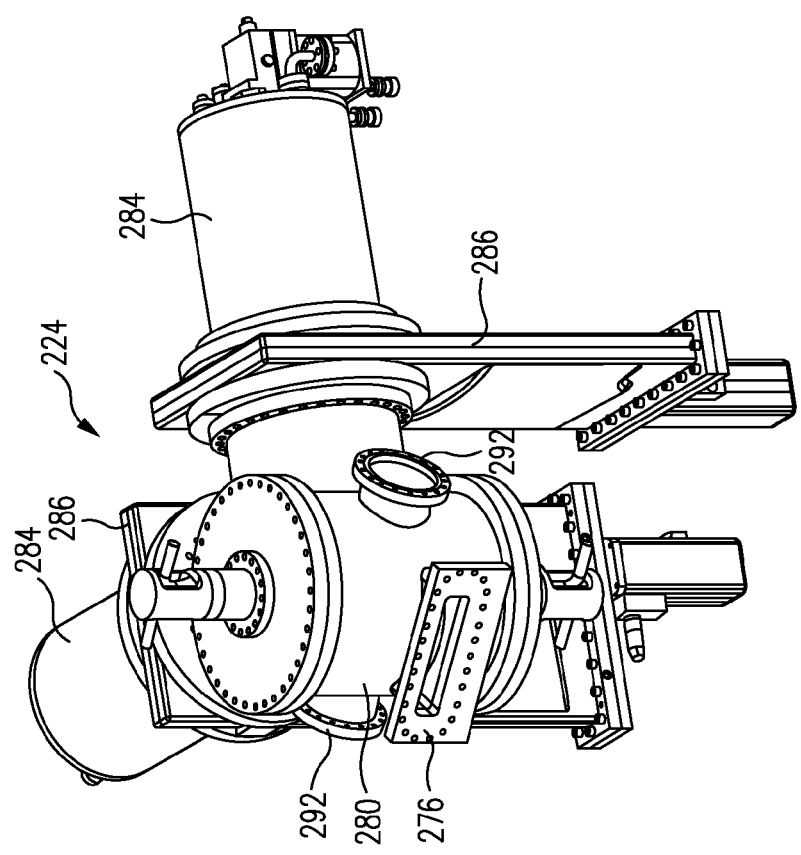
FIG. 12B
FIG. 12A

WAFER LEVEL PACKAGING OF MICROBOLOMETER VACUUM PACKAGE ASSEMBLIES

CROSS REFERENCE TO RELATED APPLICATIONS

This application claims the benefit of U.S. Provisional Patent Application No. 61/801,596 filed Mar. 15, 2013 and entitled "WAFER LEVEL PACKAGING OF MICROBOLOMETER VACUUM PACKAGE ASSEMBLIES" which is hereby incorporated by reference in its entirety.

This application claims the benefit of U.S. Provisional Patent Application No. 61/747,867 filed Dec. 31, 2012 and entitled "WAFER LEVEL PACKAGING OF MICROBOLOMETER VACUUM PACKAGE ASSEMBLIES" which is hereby incorporated by reference in its entirety.

BACKGROUND

1. Technical Field

One or more embodiments of the invention generally relate to methods, systems, and apparatuses for producing infrared (IR) detectors in volume quantities, and more particularly, for the wafer level packaging (WLP) of microbolometer vacuum package assemblies (VPAs).

2. Related Art

In commonly owned International Patent Application No. PCT/US2011/045600 filed Jul. 27, 2011, incorporated herein by reference, novel IR detectors, including microbolometer vacuum package assemblies (VPAs), are disclosed, together with methods for making them using wafer level packaging (WLP) techniques.

WLP methods and apparatuses for producing conventional semiconductor integrated circuit (IC) devices and microelectromechanical systems (MEMS) devices are known. Such techniques typically include the provision of a pair of complementary semiconductor wafers, within at least one of which has been fabricated a plurality of identical "active" devices. The two wafers are typically aligned in face-to-face abutment, bonded to each other, then cut or "singulated" into a plurality of individual devices.

In appropriate cases, WLP techniques can enable such devices to be produced reliably, efficiently and in a cost-effective manner. However, IR detectors have significantly different packaging requirements than, e.g., MEMS devices. For example, in MEMS devices, such as digital light projectors (DLPs) or inertial sensors, a greater emphasis is placed on non-corrosive environments having relatively poor "hermeticities," i.e., sealing requirements, because they are predominately concerned with moisture permeation providing an electrolyte for corrosion. By contrast, IR detector devices, such as microbolometers ("bolometers" or "bolos"), require high levels of vacuum (e.g., low pressures) and associated hermeticity (e.g., low leak rate), and place a much greater emphasis on the degassing and subsequent outgassing rates of components, effected by high temperature vacuum baking or "bake out" regimens, prior to wafer bonding. Furthermore, the multiple sealing methods, which can be utilized by conventional MEMS production, are not an option for IR WLP manufacturing as, in some cases, the associated permeation rates cannot be tolerated, and in others, temperature limitations of the bolometer structures dictate very narrow windows of possible processing temperature options.

Accordingly, a need exists in the industry for WLP methods, systems, and apparatuses that accommodate these differences in packaging requirements so as to enable the volume production of reliable, efficient, and cost-effective IR detector and microbolometer VPAs.

SUMMARY

In accordance with one or more embodiments of the present invention, methods, systems, and apparatuses are provided for the high-volume production of reliable, efficient and cost-effective IR detector and microbolometer VPAs using WLP techniques. For example for one or more embodiments, the techniques disclosed herein provide for high volume (e.g., millions as opposed to hundreds or thousands of VPAs) automated processing as well as a continuous vacuum environment to preclude the typical adsorption of contaminants during the assembly process, which may require additional processing time to reduce their significance and adverse impact on process flexibility.

In some embodiments, overall system flow may be in-situ. For example, discrete WLP subcomponents may be introduced to a specialized robotic cluster processing tool at high vacuum, and various lid and bolometer wafers may be first introduced to the robotic cluster tool via hands-off robotic assembly. For instance, each wafer may be taken from a cleanroom compatible wafer storage container (e.g., with traceability maintained by unique serialization, which may be managed by vision based manufacturing execution software (MES)), and be introduced to a vacuum load lock where a comprehensive in-situ vacuum process occurs, as described herein, resulting in completed, bonded pairs of WLP product. Such products may exit through the same load lock, resulting in completed product in wafer storage containers. In some embodiments, high vacuum may be achieved through the use of metal seals between various stages of the system, and, in some embodiments, the removal of various elastomeric seals associated with the load lock, a bakeout chamber, and associated elevator assemblies.

In one example embodiment, a method for the wafer level packaging (WLP) of microbolometer vacuum package assemblies (VPAs) comprises providing a bolometer wafer and a lid wafer. The bolometer wafer is mounted on a bolometer wafer chuck and the lid wafer is mounted on a lid wafer chuck disposed in facing opposition to the bolometer wafer. The bolometer wafer is baked at a first temperature using the bolometer chuck, and the lid wafer is baked at a second temperature using the lid wafer chuck. The respective temperatures of the bolometer wafer and the lid wafer are then raised to a common bonding temperature using the bolometer and lid wafer chucks, and the bolometer wafer and the lid wafer are pressed together with a selected force, such that the wafers are bonded together in a bonded wafer pair. The temperature of the bonded wafer pair is then lowered below the common bonding temperature. Throughout the foregoing, the providing, mounting, baking, raising, clamping and lowering are effected in an ultra-high vacuum (UHV) environment.

In another example embodiment, an apparatus for the wafer level packaging (WLP) of microbolometer vacuum package assemblies (VPAs) can include a wafer alignment and bonding chamber, a bolometer wafer chuck and a lid wafer chuck disposed within the chamber in vertically facing opposition to each other, means for creating a first ultra-high vacuum (UHV) environment within the chamber, means for heating and cooling the bolometer wafer chuck and the lid wafer chuck independently of each other, means for moving the lid wafer chuck in the vertical direction and relative to the bolometer wafer chuck, means for moving the bolometer wafer chuck translationally in two orthogonal directions in a horizontal plane and rotationally about a vertical axis normal to the horizontal plane, and means for aligning a fiducial on a bolometer wafer held by the bolometer wafer chuck with a fiducial on a lid wafer held by the lid wafer chuck.

Embodiments of the invention and their several advantages are best understood by referring to the detailed description that follows. It should be appreciated that like reference numerals are used to identify like elements illustrated in one or more of the figures.

BRIEF DESCRIPTION OF THE SEVERAL VIEWS OF THE DRAWINGS

FIGS. 1A-1F are partial side elevation views of steps involved in the WLP production of an example embodiment of a microbolometer VPA in accordance with one or more embodiments of the present invention;

FIGS. 12A and 12B are top and side perspective view and a partial broken away top and side perspective view, respectively, of an example embodiment of a wafer alignment and bond module of the WLP apparatus;

DETAILED DESCRIPTION

Figure 2:
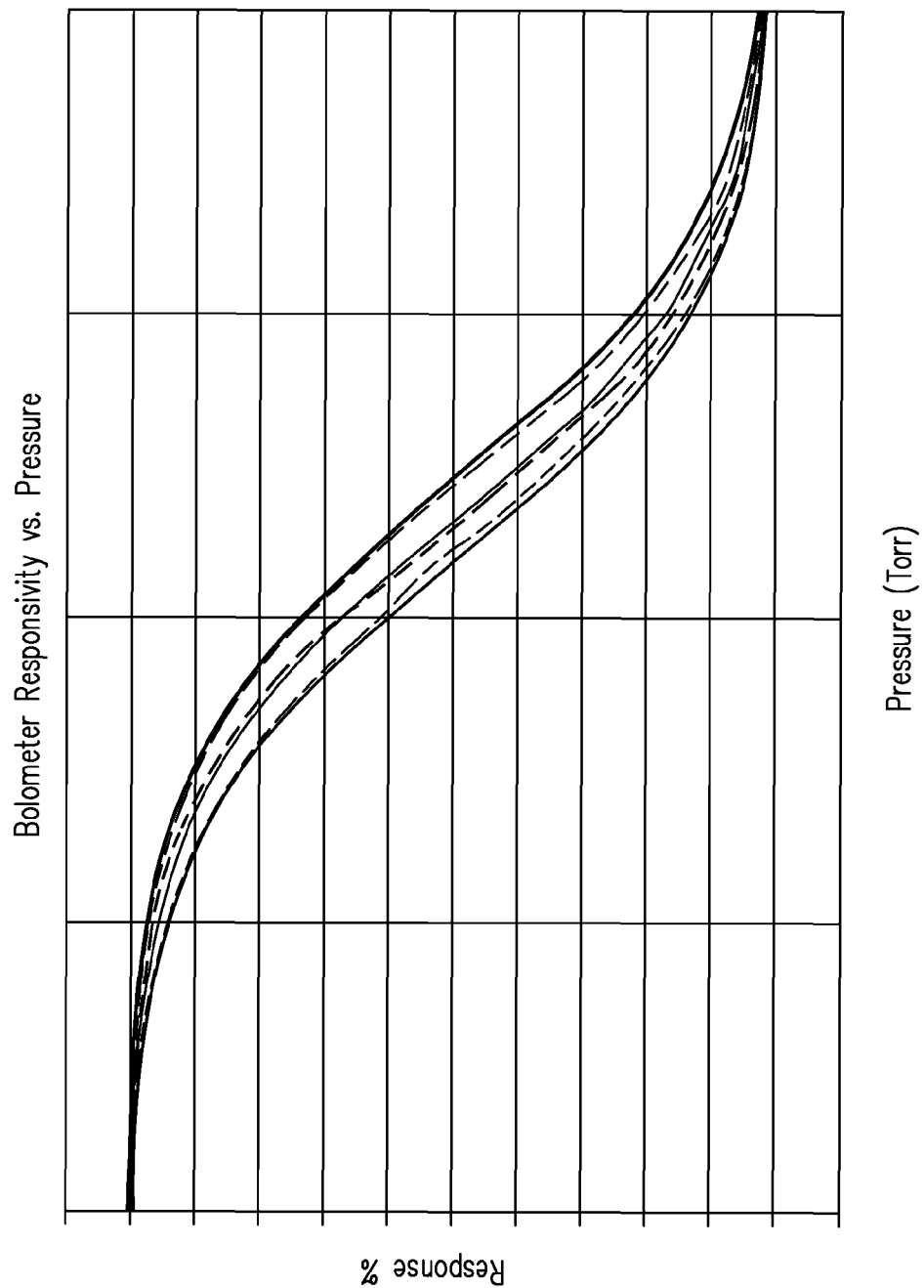
FIG. 2 is a graph of the responsivity of various example bolometer packages as a function of the level of vacuum contained therein.

In accordance with one or more embodiments of the present invention, various embodiments of methods, systems, and apparatuses are provided for the high-volume production of reliable, efficient and cost-effective IR detector and microbolometer VPAs using WLP techniques.

FIGS. 1A-1F are partial side elevation views of steps and components involved in the production of an example embodiment of a microbolometer VPA 100, such as for example of a type described in the above-referenced International Patent Application No. PCT/US2011/045600 and produced in accordance with the WLP techniques discussed therein. As illustrated in FIGS. 1A and 1B, the WLP method can begin with the provision of two wafers made of a semiconductor, e.g., silicon, comprising a "lid" wafer 102 and a "bolometer" wafer 104, formed using e.g., photolithography techniques, to incorporate corresponding pluralities of IR-transparent windows 106 and IR detectors, e.g., microbolometer arrays 108, respectively.

As illustrated in FIG. 1A, in some embodiments, the lid wafer 102 can include a plurality of "mesas" 110 bonded to the lid wafer 102 disposed below corresponding ones of the windows 106. Each mesa 110 has closed marginal side walls that can be disposed between an outer periphery of a lower surface of the lid wafer 102 and an outer periphery of the upper surface of the bolometer wafer 104 so as to define a closed cavity 112 between the lid wafer 102 and the bolometer wafer 104 that serves to enclose a corresponding one of the IR detector arrays 108 therein. In some embodiments, the window and bolometer wafers 102 and 104 can each be provided with sealing rings 114, e.g., solder rings, that can be used to bond the mesas 110 to the substrate 102 so as to seal the cavity 112, i.e., to provide a hermetic seal for an evacuated WLP VPA.

In some embodiments, the upper and/or lower surfaces of the windows 106 of the lid wafer 102 can include an antireflective (AR) coating 116, to prevent infrared light incident upon the coated surfaces from being reflected away from the corresponding microbolometer arrays 108 disposed therebelow. As illustrated in, e.g., FIG. 1F, in other embodiments, a "getter" 118 can be formed on a lower surface of the windows 106 and used to adsorb gas molecules remaining in the respective cavities 112 after they are sealed. Additionally, in some embodiments, the infrared detectors 108 can include electrical test pads 120 disposed on the upper surface of the bolometer wafer 104 and adjacent to the respective outer peripheries of the windows 106. The test pads 120 can be coupled to readout integrated circuits (ROIC) respectively coupled to corresponding ones of the IR detectors 108 and used to test the infrared detectors 108 electrically at the wafer level and before they are is "singulated," i.e., separated from the bonded wafer pair 122.

As illustrated in FIGS. 1C and 1D, a method for making the VPA 100 can include precisely aligning the lid wafer 102 with the bolometer wafer 104, urging the two wafers together, as indicated by the arrows 124 in FIG. 1D, with a predetermined compressive force, and then heating the wafers in a vacuum environment until the respective solder rings 114 melt and reflow into each other so as to join the two wafers into a bonded wafer pair 122 containing a plurality of evacuated VPA packages 100. As illustrated in FIG. 1E, a portion of the lid wafer 102 can be removed, e.g., by sawing, to expose the pads 120 so as to enable a wafer level electrical test of the individual VPA packages 100 to be performed using, e.g., a "probe card," before a final separation of the individual packages 100 from the wafer pair 122. As illustrated in FIG. 1F, a final cut can be made through the bolometer wafer 104 to separate the individual VPA packages 100 from the wafer pair 122.

As discussed above, a major consideration in making IR detector packages 100, such as the example embodiment illustrated in FIG. 1F, is the requirement that the components, particularly the bolometer wafer 104, be de-gassed to the greatest extent practical before wafer bonding is effected. However, conventional IC and MEMS WLP methods and apparatuses have different requirements as noted herein, in contrast to IR detector packages for one or more embodiments that require maximizing and maintaining (e.g., for a period of at least 10 years over varying diurnal temperature environments) the WLP package vacuum, while working within the limitations of the bolometers and the getter used in the package. Working with these systems, for one or more embodiments, the best results are achieved by a WLP method that includes one or more of the following:

1. "Prebaking" (i.e., before wafer bonding) one or both types of wafers to degas them as much as possible;

2. Using extended bake out periods within the wafer bonding system at relatively low temperatures to clean up the window or "lid" and bolometer wafers, but without activating the getter;

3. Clamping the lid and bolometer wafers together before bonding to preclude the getter from pumping the entire bonding chamber environment when the getter is "activated," typically by raising its temperature to an elevated "getter activation" temperature; and 4. Ramping the temperature of the wafers up to the soldering temperature with the wafers firmly clamped together.

The foregoing method results in conventional non-WLP VPA packages with about 60% to 70% of full "responsivity," i.e., input vs, output gain of the IR detector. As discussed in connection with the graph of FIG. 2, this is indicative of an internal pressure, for a typical VPA microbolometer array package, of about 1E-1 Torr ($1\times10^{-1}$ Torr), and to achieve this level of responsivity, the getter has used the great majority of its adsorption capacity, although a small remnant of getter capacity remains, which continues to adsorb gas in the package and thereby increase detector responsivity for an indeterminate period of time. "Activation" of the getter, e.g., by heating, subsequent to vacuum sealing enhances its ability to absorb most of the remaining gases in the package, resulting in an internal pressure of about 1E-3 Torr ($1\times10^{-3}$ Torr). Subsequent to the aforementioned "activation", the getter has some residual capacity to adsorb gases which can act to maintain the required lowered gas pressure for an extended period of time.

Conventional WLP methods and apparatuses are limited and driven primarily by the limitations of the conventional IC and MEMS wafer bonders. The primary limitation is chamber vacuum, while other limitations include the lack of independent heating and cooling of both bolometer and lid wafers. Conventional wafer bonders are capable of achieving a vacuum of about 6E-7 Torr after a pump down of >24 hours when empty of product and at room temperature. Chamber pressure during WLP bonding, during the ramp to bonding temperature, ranges from about 6E-6 Torr for 6 in. diameter wafers to about 5E-5 Torr for 8 in. diameter wafers. These pressures generate a molecular layer deposition rate on an active getter of one monolayer every 0.05 to 0.16 seconds. Accordingly, this indicates that the getter in the package should be protected from the chamber pressure gas load while the getter is heated to its activation temperature. If it is not so protected, it can become saturated during heating as a result of adsorbing ambient gas from the bonding chamber.

Protecting the activated getter from the gas load of the chamber means that the lid wafer should be clamped firmly against the bolometer wafer before their respective temperatures are ramped up from the outgassing bake temperature to the wafer soldering temperature. In one example embodiment, bake temperatures for the two wafers can be different for the lid wafer and for the bolometer wafer, and, in some embodiments, can be maintained below the getter activation temperature. An example of getter activation temperatures can be above the bake temperatures for the two wafers, and/or above about 200 degrees Celsius. If, as described above, solder rings are used to join the two wafers, the soldering temperature can be within the getter activation temperature regime. It should be noted that all gas released during this temperature increase is trapped within the package. This "gas load" must be adsorbed by the getter effectively to achieve a vacuum that is appropriate for maximum, i.e., ~100%, bolometer responsivity.

Regarding wafer temperature control, conventional wafer bonders have no ability to cool the upper wafer chuck. This creates a limitation, in that it is not possible to heat the bolometer wafer to a much greater temperature above the temperature of the lid wafer. Attempts to exceed this temperature differential, achieved by holding the bolometer wafer on a hot lower wafer chuck and the lid wafer on a relatively cooler upper wafer chuck, can result in the lid wafer being substantially heated by heat radiated from the bolometer wafer. The upper wafer chuck, having no ability to cool itself, cannot maintain a lower temperature and therefore cannot create a large temperature difference between the bolometer and lid wafers.

It is possible to produce an IR VPA package without getters and then to test it for responsivity so as to provide a measurement of the gas trapped inside the package. Puncture testing with residual gas analysis (RGA) can provide another measurement of trapped gas—however puncture test results generally provide only a single data point. The pressures listed in the table below are calculated from responsivity tests done on a number of IR detector packages, in which the number of devices tested is listed in the table. The pressure in the packages is obtained from the measured responsivity vs. pressure of the graph of FIG. 2, which is a plot incorporating both calculated and measured values of IR detector sensitivity vs. package internal pressure.

There are a number of benefits associated with being able to heat the lid and bolometer wafers separately before clamping them together. For example, such process may allow the required getter surface area to be reduced. This, in turn, allows for reduction of the window size, which would otherwise be enlarged to accommodate the getter, and thus permits further reductions in the overall package (VPA) size. Such process may also permit the use of solders and seal ring metalizations that degas more than those currently used, by, at least in part, permitting such degas into the chamber during solder reflow and, thereby, not into the sealed package. This enables the use of metals and/or materials that are less expensive to deposit and more suitable for high volume production (e.g., sputtering and plating process materials, for example). Such process may also contribute to improved robustness to process variations, for example, and/or provide process time reductions.

With respect to the getter, based on gas load data, it is reasonable to assume that the gas load the getter is required to adsorb is greater than its surface adsorption capacity. In light of the foregoing, a process that enables a WLP IR detector package to be sealed with a substantially unimpaired getter capacity could produce a more robust, long lived WLP IR package. The foregoing provides a first order quantification of the advantages afforded by clamping the lid and bolometer wafers tightly together in the bond chamber prior to ramping up their temperatures to the soldering temperature.

Additionally, getter surface saturation occurs when the getter surface has trapped a sufficient number of molecular layers of gas that the getter surface attraction for new gas molecules, working thru the thickness of the layers already stuck to the getter, is not able to increase the net number of trapped gas molecules on the getter surface. It is difficult to quantify how many molecular layers equal surface saturation of the getter easily, as this is a function of the particular getter surface shape, conductance within the getter surface, and so on. However, saturation requires a number of molecular layers, and the number of molecular layers at surface saturation significantly exceeds one.

At a pressure of 1E-6 Torr, one layer of gas molecules impacts the getter surface about every second. At a pressure of 1E-7 Torr, this changes to about 10 seconds per molecular layer. At 1E-8 Torr, this changes to about 100 seconds per layer, and at 1E-9 Torr, to about 1,000 seconds. At 1E-10 Torr, it changes to about 10,000 seconds per layer. Thus, between bonding chamber pressures of 1E-9 Torr and 1E-10 Torr, it takes between 16 minutes and 166 minutes to deposit one molecular layer on a typical getter. This means that, at these vacuum levels, the getter can be active and exposed to the bonding chamber environment for an extended period of time with little reduction of its residual adsorption capacity.

In light of the foregoing, an advantageous WLP process should seal the WLP package with a minimum of trapped gas for the getter to adsorb. The getter will thereby retain a large proportion of its total adsorption capacity. The trapped gas quantity should be a small fraction of the available getter capacity. The getter capacity should be adequate to adsorb the trapped gas so as to yield a ~100% bolometer responsivity, and it should have the capacity to do this with the variables in gas load which can occur with different types of window and bolometer wafers. Thus, an advantageous wafer bonder should be capable of achieving the lowest possible pressures during the ramp up of the wafers to soldering temperature.

Additionally, each of the two "wafer chucks" respectively used to hold and manipulate the upper and lower, i.e., lid and bolometer wafers (e.g., via one or more electrostatic clamps (ESCs)), should be equipped with the capability of both heating and cooling their respective wafers.

Further, the wafer bonder should be able to bake out bolometer and lid wafers at the respective ideal temperatures for each wafer for a given desired application. It should then ramp the wafers to close to the soldering temperature, while they are separated and being pumped. The vacuum should be maintained at a high enough level to cause little getter capacity loss. It should then clamp the wafers together, raise them to the final soldering temperature to effect sealing, and then cool them down rapidly without adversely impacting the solder microstructure.

In accordance with the foregoing considerations, one advantageous embodiment of an apparatus for the WLP production of VPA IR detector packages could include the following features:

1. One or more relatively large cryogenic pumps ("cryopumps") for pumping the wafer bonding chamber to ultra-high vacuum (UHV) levels;

2. The bonding chamber should be per standard good practice, for example, electropolished 304 L stainless steel or equivalent, have a minimized volume, and so on;

3. The apparatus should incorporate all metal seals, except for the loading port, which could be via a load lock chamber incorporating conventional seals;

4. A load lock loading chamber and/or one or more bake out chambers operating at high vacuum levels, and capable of heating the incoming parts to vacuum bake temperatures before they are moved into a separate wafer bonding chamber;

5. Lid and bolometer wafer chucks that have both wafer heating and wafer cooling systems as well as ESC's for clamping the wafers to the heating and cooling chucks;

6. A retractable radiation shield disposable between the lid and bolometer wafers, which prevents radiant heating of the lid wafer by the bolometer wafer;

7. To the greatest extent practical, all wafer processing should be effected in situ, i.e., in a UHV environment.

Figure 3:
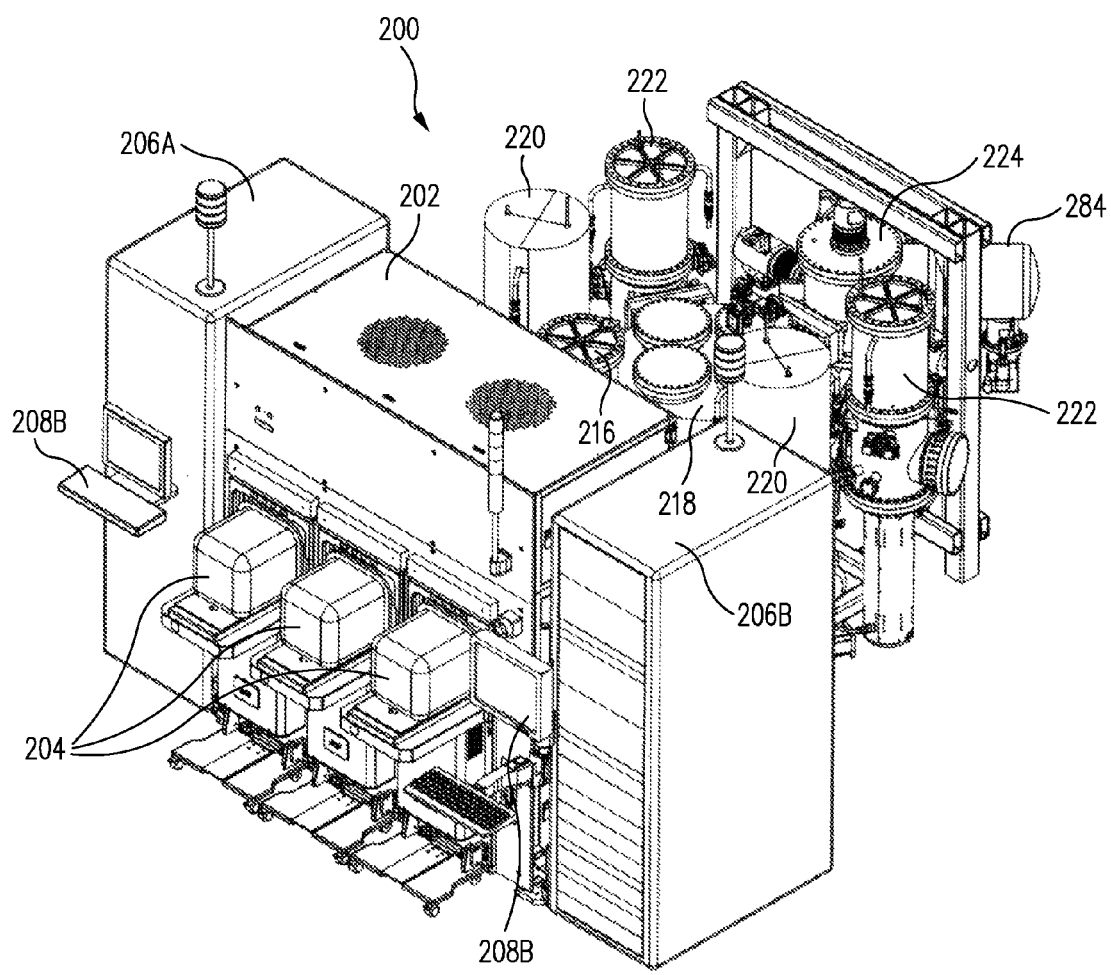
FIG. 3 is a front and top perspective view of an example embodiment of an apparatus for the WLP production of microbolometer VPAs in accordance with one or more embodiments of the present invention.

FIGS. 3-21 illustrate example embodiments of a novel WLP apparatus 200 in accordance with one or more embodiments of the present invention that incorporates one or more of the above and many other features and advantages. FIG. 3 is a front and top perspective view of the example apparatus 200, FIG. 4 is a top plan view thereof, and FIG. 5 is a transverse-plane cross-sectional view thereof.

Figure 4:
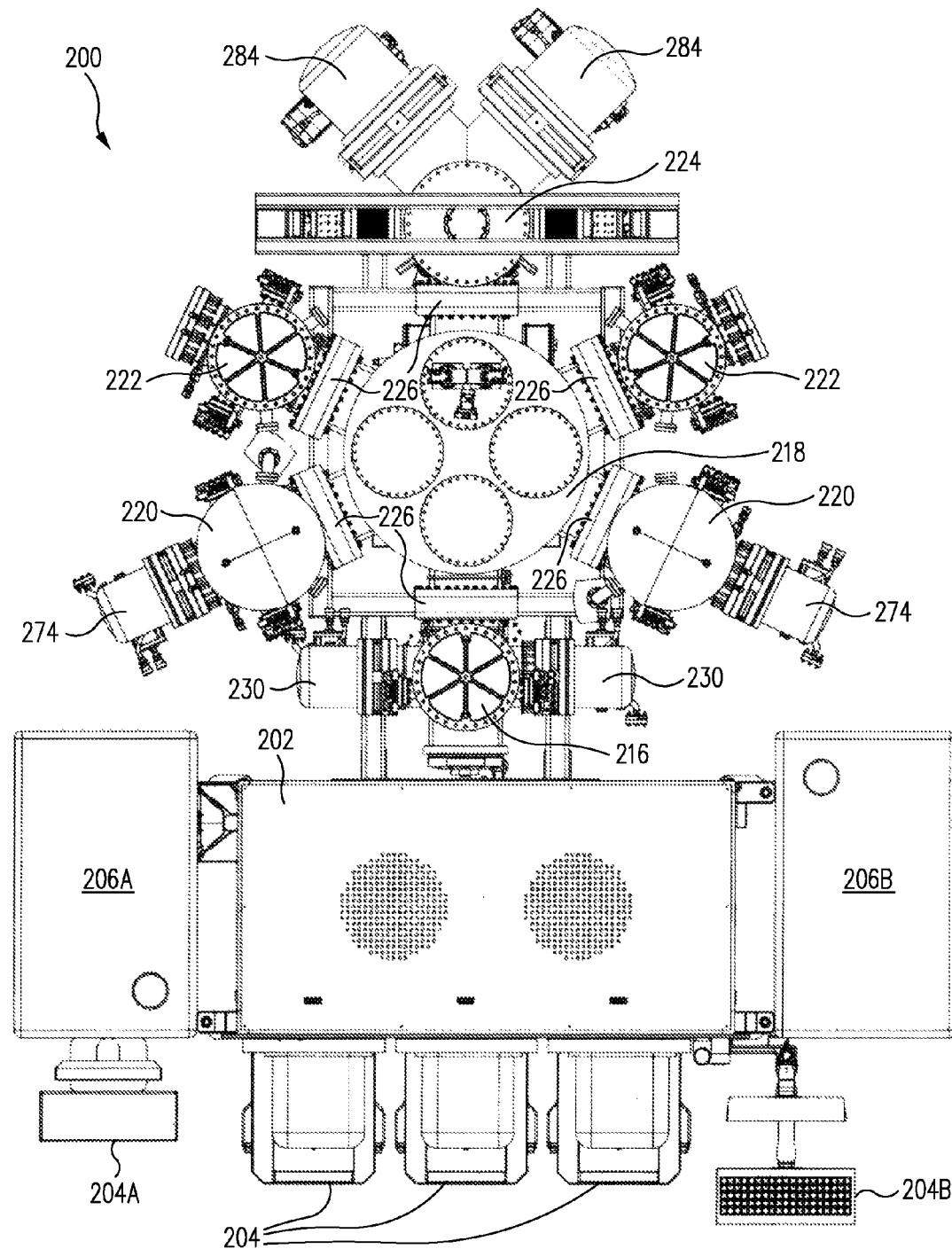
FIG. 4 is a top plan view of the WLP apparatus of FIG. 3.
Figure 5:
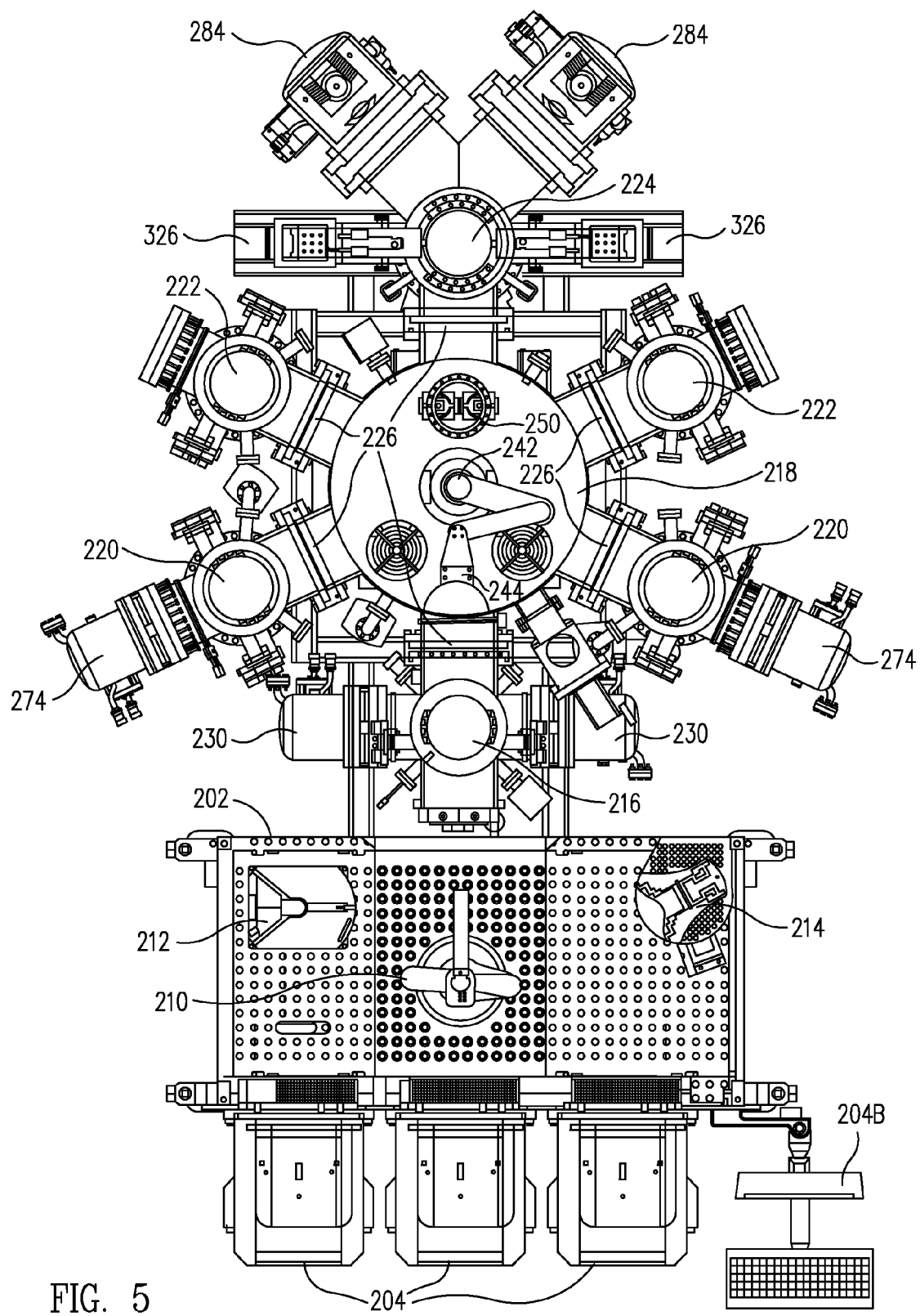
FIG. 5 is a transverse-plane cross-sectional view of the WLP apparatus.

As may be seen in FIGS. 3-5, the example WLP apparatus 200 comprises an Equipment Front End Module (EFEM) 202 that includes an Open Cassette Adapter (OCA) 204, a pair of instrumentation units 206A and 206B disposed on opposite sides of the EFEM 202, and a similarly situated pair of operator consoles 208A and 208 B (the latter being shown in a position deployed for use by an operator). As can be seen in the transverse-plane cross-section of FIG. 5, the EFEM 202 can incorporate a wafer handling robot 210, a wafer pre-aligner 212, and a wafer mapper/identifier 214.

The OCA 204 is capable of sealingly receiving a number of, e.g., three, clean room wafer cassettes, e.g., a lid wafer cassette, a bolometer wafer cassette, and a bonded wafer pair cassette, each capable of storing, e.g., 25 wafers or wafer pairs in a vertically tiered fashion. The EFEM 202 transfers wafers to and from the clean room cassettes to the downstream in-vacuum processing equipment of the WLP apparatus 200 described in more detail below. Accordingly, in one embodiment, the EFEM 202 can handle the wafers at atmospheric pressure in a class 10 clean room environment maintained by an ISO Class 1 laminar flow/Hepa air filtration system. Using the wafer handling robot 210, an operator of the apparatus 200 can remove wafers from (or insert bonded wafer pairs into) the corresponding clean room cassettes, scan and identify each wafer, pre-align each wafer for insertion into a load lock module 216 of the apparatus discussed below, load the wafers into the load lock module 216 as required, and unload bonded wafer pairs from the load lock module 216 and insert them into the bonded wafer pair cassette.

As further illustrated in FIGS. 3-5, the WLP apparatus 200 can further include the above-mentioned load lock module 216 disposed immediately adjacent to and in communication with the EFEM 202, a central chamber 218 disposed adjacent to and in communication with the lock load module 216, a pair of bake out modules 220 disposed on opposite sides of the apparatus 100 and in communication with the central chamber 218, a pair of buffer modules 222 disposed on opposite sides of the apparatus 200 and in communication with the central chamber 218, and an alignment/bonding module 224 disposed adjacent to and in communication with the central chamber 218. Thus, as can be seen in FIGS. 3-5, in one example embodiment, the load lock module 216, the bake out modules 220, the buffer modules 222 and the alignment and bonding module 224 are arrayed around the central chamber 218 at selected angular increments, and each is disposed in communication with the central chamber 218 via an associated UHV slot valve 226 (see FIGS. 4 and 5) configured to allow a wafer or bonded wafer pair to be translated therethrough.

Figure 6B:
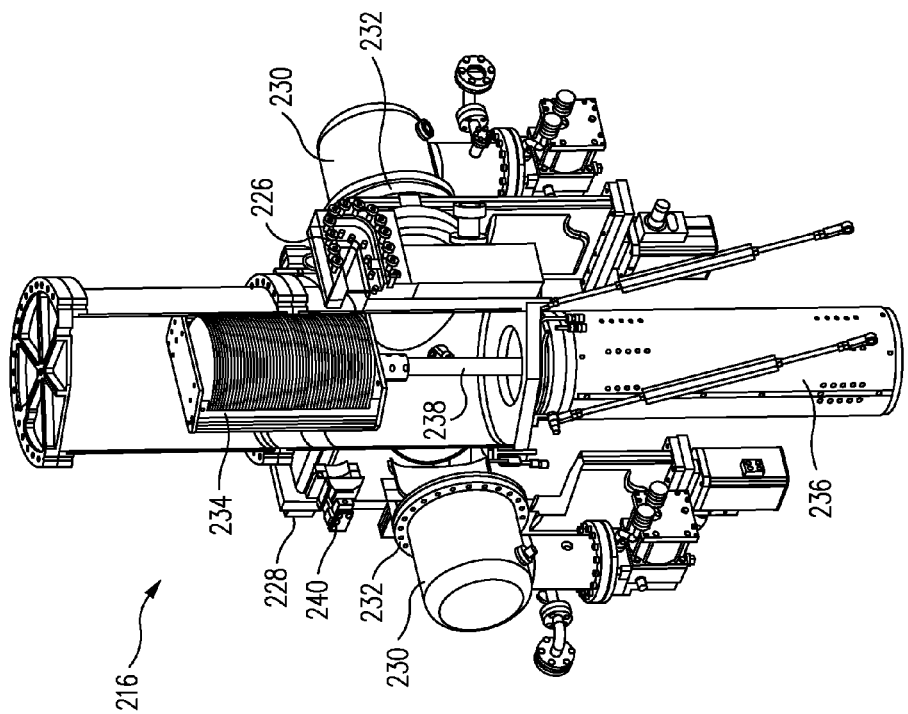
FIGS. 6A and 6B are top and side perspective and partial cross-sectional perspective views, respectively, of an example embodiment of a load lock module of the WLP apparatus.
Figure 6A:
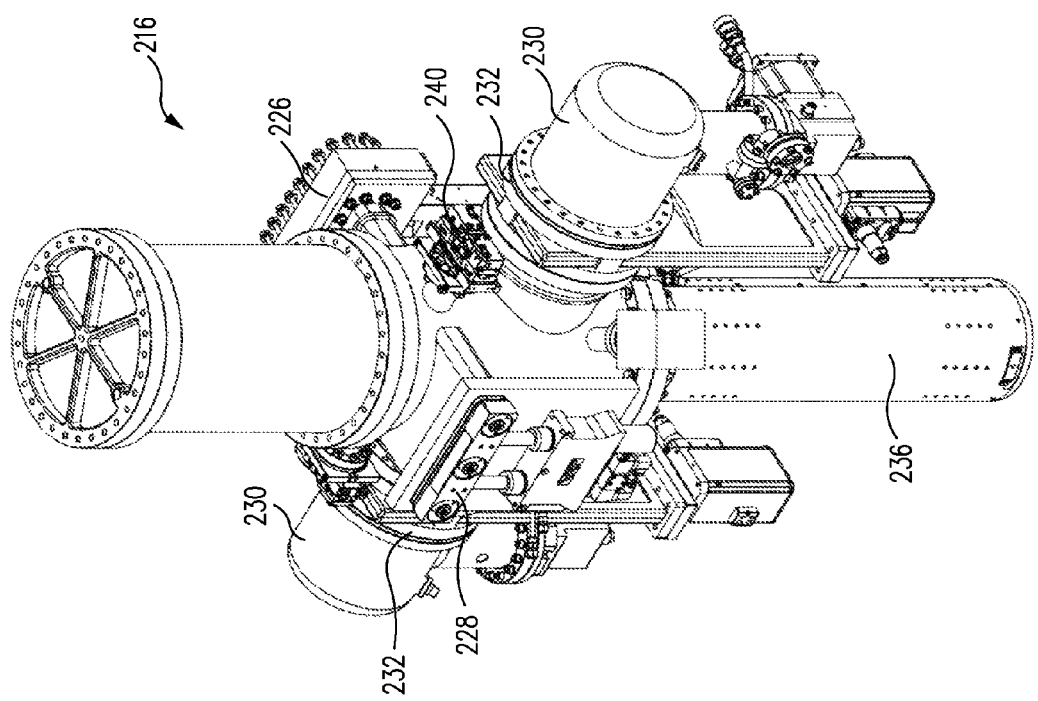

FIGS. 6A and 6B are top and side perspective and partial cross-sectional perspective views, respectively, of an example embodiment of a load lock module 216 of a type that can be used advantageously in the WLP apparatus 200. The load lock module enables the transfer of all wafers and bonded wafer pairs to or from the atmospheric environment of the EFEM 202 and to or from the UHV processing environment of the apparatus 200, and in particular, to or from the central chamber 218, as discussed above. Thus, all components (bolometer wafers, lid wafers, and bonded wafer pairs) going to or from wafer processing pass through the load lock module 216.

As illustrated in FIGS. 6A and 6B, the internal volume of the load lock module 216 can interface with the EFEM 202 through an atmospheric gate valve 228, and as discussed above, can communicate with the central chamber 218 through a UHV gate valve 226. To maximize pump down capability, the load lock module 216 can be equipped with, for example, a relatively high-volume, low-vacuum "roughing pump" (not illustrated) for rough pumping of the internal volume, as well as two 8 inch cryopumps 230, each of which can communicate with the module via, e.g., an UHV gate valve 232.

As illustrated in FIG. 6B, the load lock module 216 can be equipped with a vertically movable cassette 234 that is capable of holding, for example, multiple wafers or bonded wafer pairs, i.e., about twice the capacity of each of the clean room cassettes described above. To effect vertical movement of the cassette 234, e.g., for the loading and unloading of wafers from the cassette 234, the load lock module can be equipped with an elevator 236 having a vertically movable shaft 238, and the vertical position of the cassette 234, and hence, the individual wafers therein, relative to the openings in the slot or gate valves 226 and 228, can be precisely controlled using, for example, a laser positional sensor 240. The positional sensor 240 can be used to precisely align any one of the wafers or bonded wafer pairs in the cassette 234 with the "end effector" of either the EFEM wafer handling robot 210 (see, e.g., FIG. 5) or a wafer handling robot 242 located in the central chamber 218. In some embodiments, the load lock module 216 can be provided with external heaters (not illustrated) to provide it with a "self-bake-out" capability.

Figure 7:
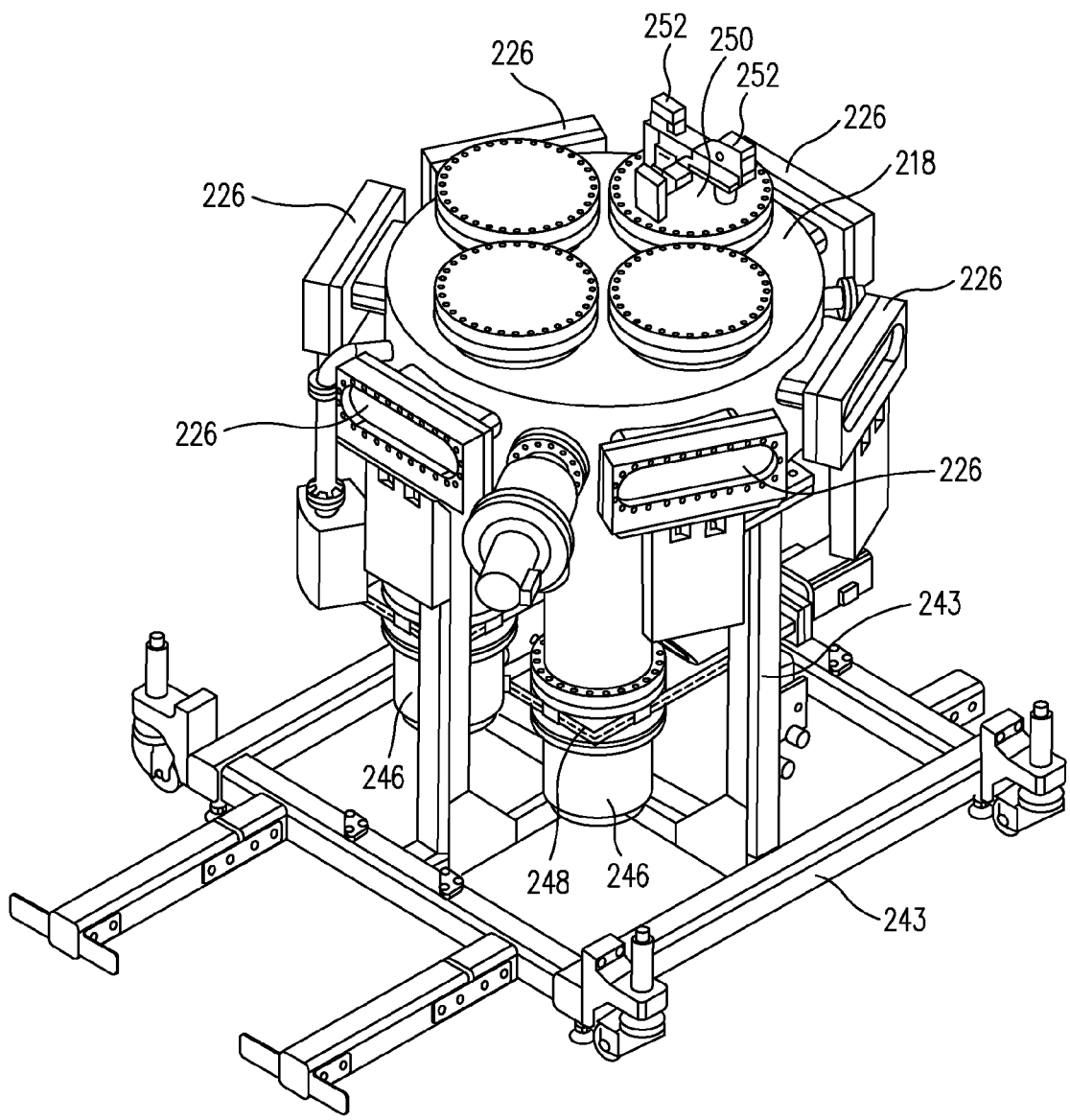
FIG. 7 is a top and side perspective view of an example embodiment of a central chamber of the WLP apparatus.
Figure 8:
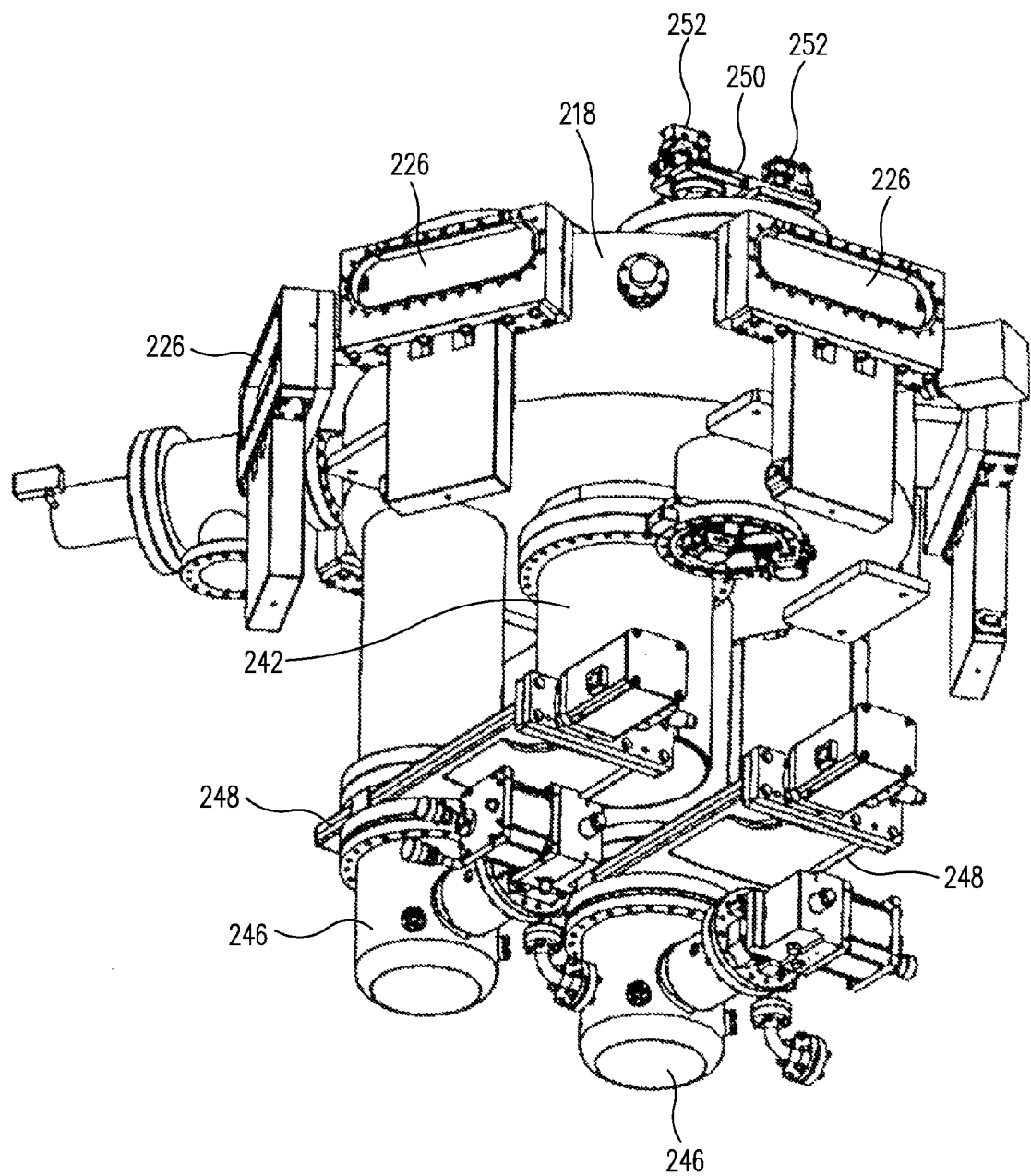
FIG. 8 is a bottom and side perspective view of the central chamber of FIG. 7.

FIG. 7 is a top and side perspective view of the central chamber 218 of the WLP apparatus 200, shown supported by appropriate structural framing members 243, and FIG. 8 is a bottom and side perspective view thereof, in which the structural framing members have been omitted. As illustrated in FIG. 8 and in the transverse plane cross-sectional view of FIG. 5, the central chamber 218 can comprise a hollow, generally cylindrical pressure vessel having a centrally located wafer handling robot 242. The robot 242 can include an arm with an "end effector" 244 thereon that is capable of extending through each of the UHV slot valves 226 arrayed around the circumfery of the chamber 218 and communicating with corresponding ones of the load lock module 216, the bake out modules 220, the buffer modules 222 and the alignment/bonding module 224, as discussed above, thereby enabling it to selectably deliver either wafers or wafer pairs to, or fetch them from, respective ones of the foregoing processing modules.

In some embodiments, the central chamber 218 can be provided with a relatively high-volume, low-vacuum "roughing pump" (not illustrated) for rapid rough pumping of its internal volume, as well as one or more cryopumps 246, each of which can communicate with the central chamber 218 via, e.g., a UHV gate valve 248, and which can enable it to achieve a UHV internal vacuum level. Additionally, in some embodiments, the central chamber 218 can include heaters, such as heater blankets (not illustrated), on its external surface to provide it with a self-bake-out capability.

Figure 9:
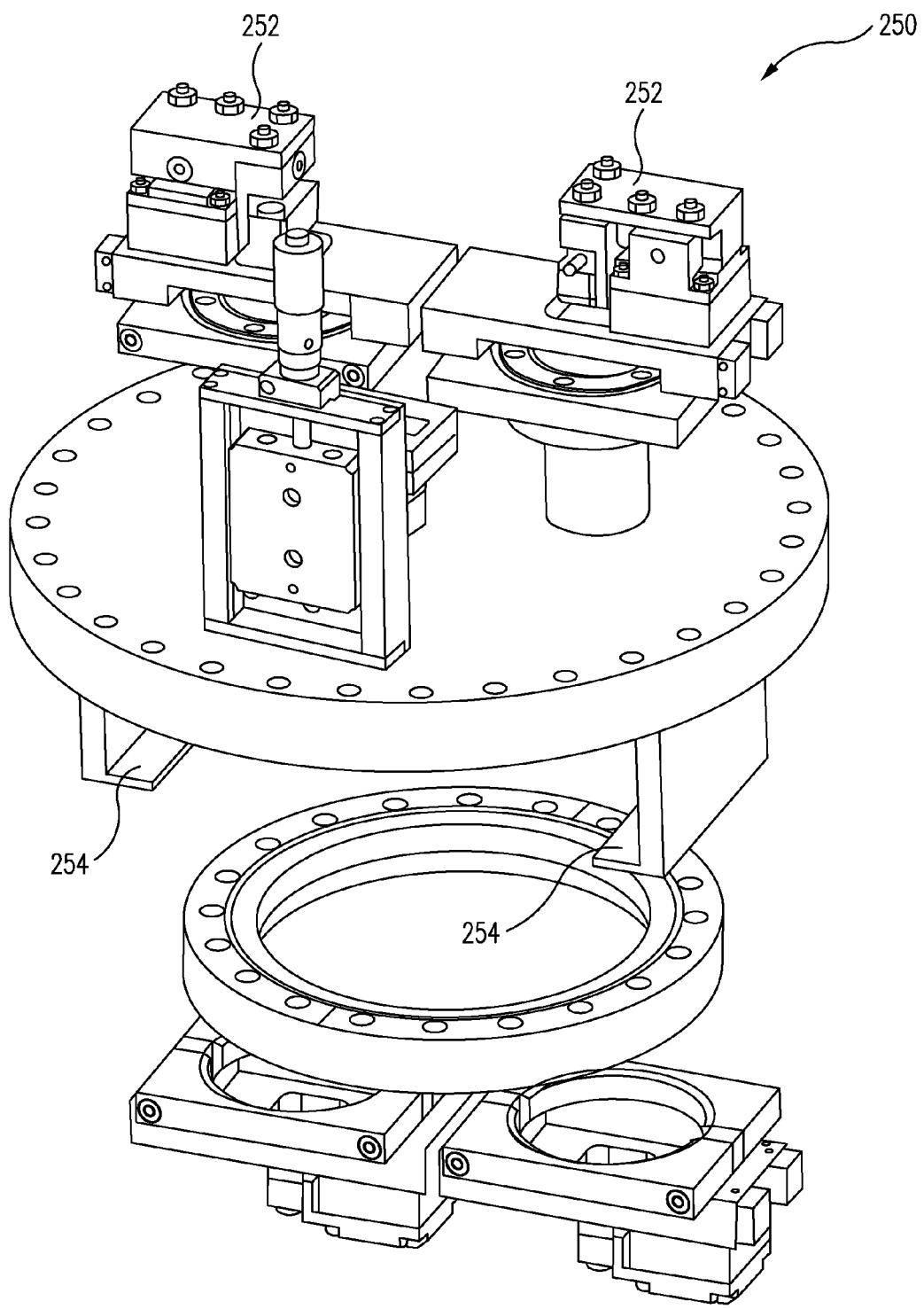
FIG. 9 is a partial top and side perspective view of an example embodiment of a pre-aligner and post inspection module of the central chamber.

In addition to the foregoing, as illustrated in FIGS. 7 and 8, in some embodiments, the central chamber 218 can include a pre-aligner and post-bonding inspection module 250. FIG. 9 is a partial top and side perspective view of an example pre-aligner and post-bonding inspection module 250 of the central chamber 218, which is located immediately adjacent to the alignment/bonding module 224. As can be seen in FIG. 9, the pre-aligner and post-bonding inspection module 250 includes a pair of optical sensors 252, e.g., IR cameras, located outside of the vacuum environment of the central chamber 218 that look through respective optical ports in the walls of the chamber to detect the X-Y positions of three points located on a wafer disposed on the end effector 244 of the wafer handling robot 242 of the central chamber 218. This measurement enables the X-Y position in which the wafer is placed in any one of the processing modules, e.g., the alignment/bonding module 224 to be precisely calibrated.

Similarly, the detectors 252 can look through the windows of the lid wafer and at a mating bolometer wafer either before or after the two wafers are bonded to each other. Accordingly, the pre-aligner and post-bonding inspection module 250 can be used advantageously during the alignment of the wafer pair prior to bonding, and then after bonding to verify the accuracy of wafer alignment. As illustrated in FIG. 9, in some embodiments, a shelf 254 can be provided in the module 250 for supporting a subject wafer or wafer pair to allow for wafer cooling and/or relative stability of the subject wafer or wafer pair during imaging by the detectors 252.

Figure 10A:
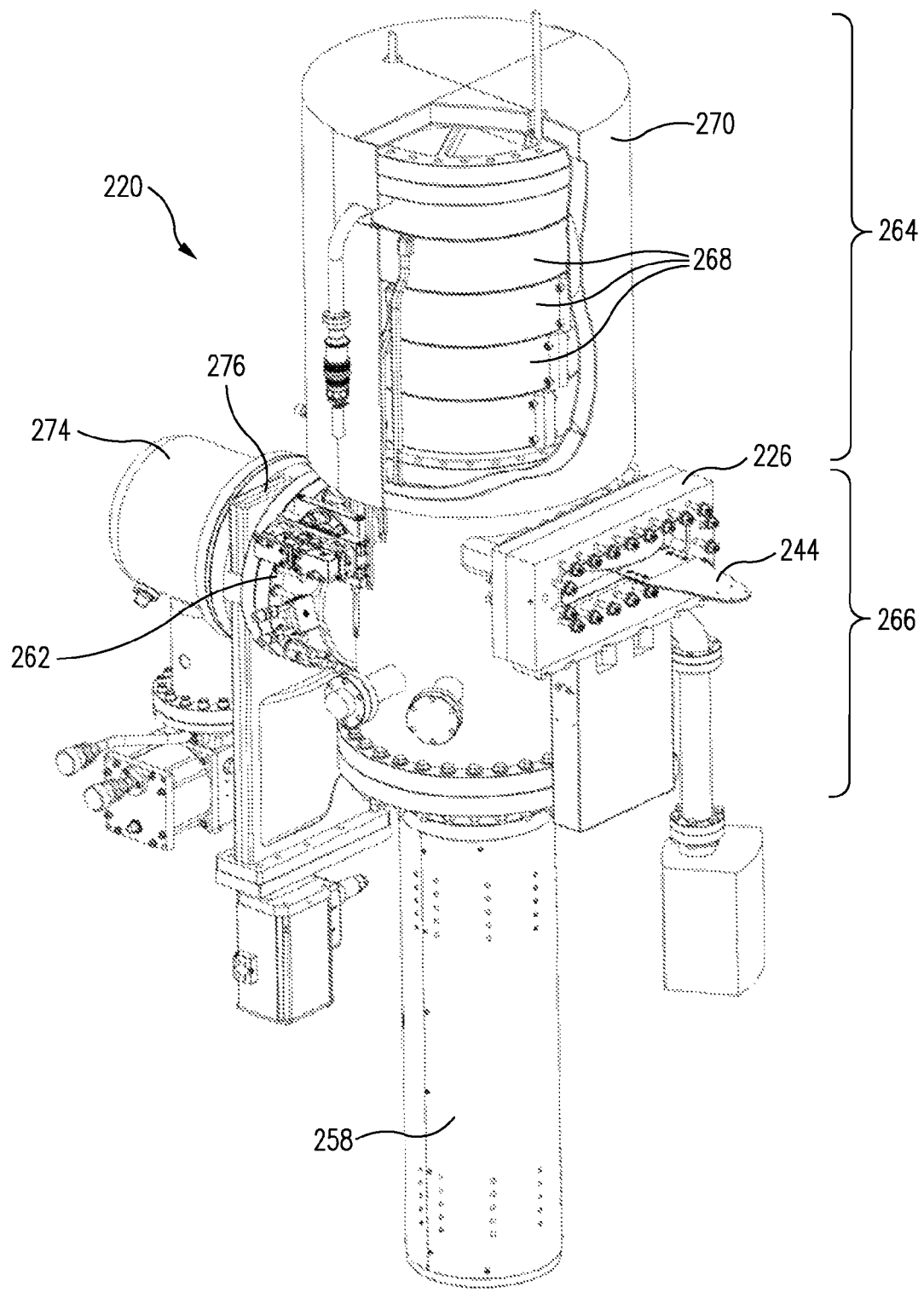
FIG. 10A is a partial broken away top and side perspective view of an example embodiment of a bake out module of the WLP apparatus.
Figure 10C:
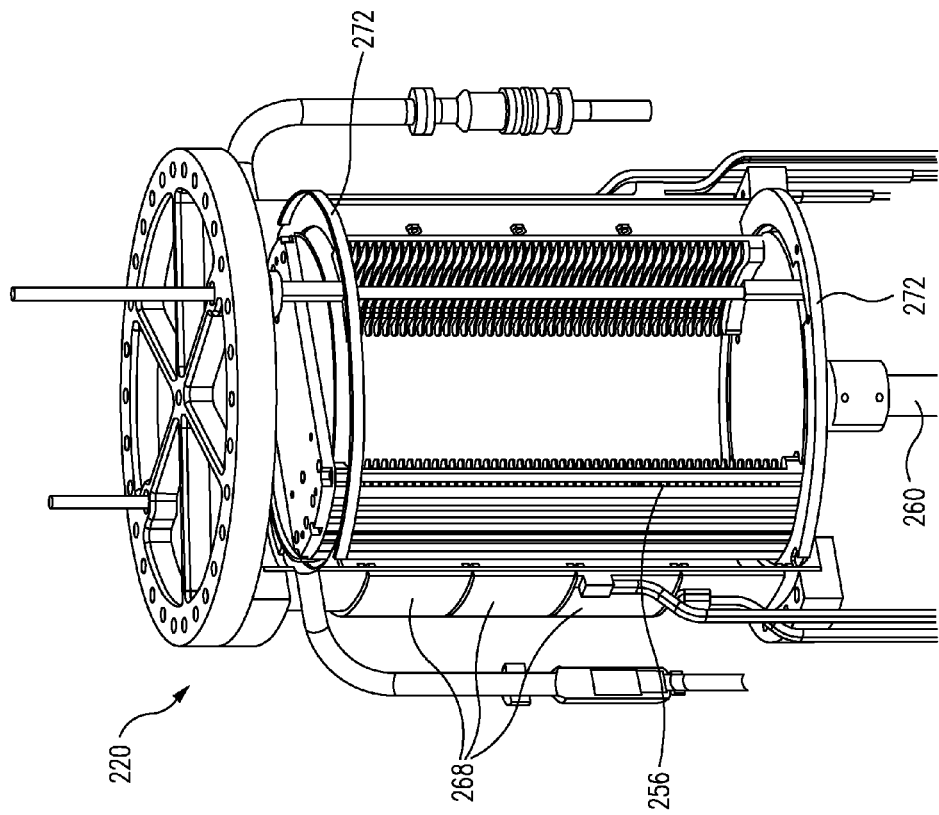
FIG. 10C is a partial broken away top and side perspective view of the bake out module.
Figure 10B:
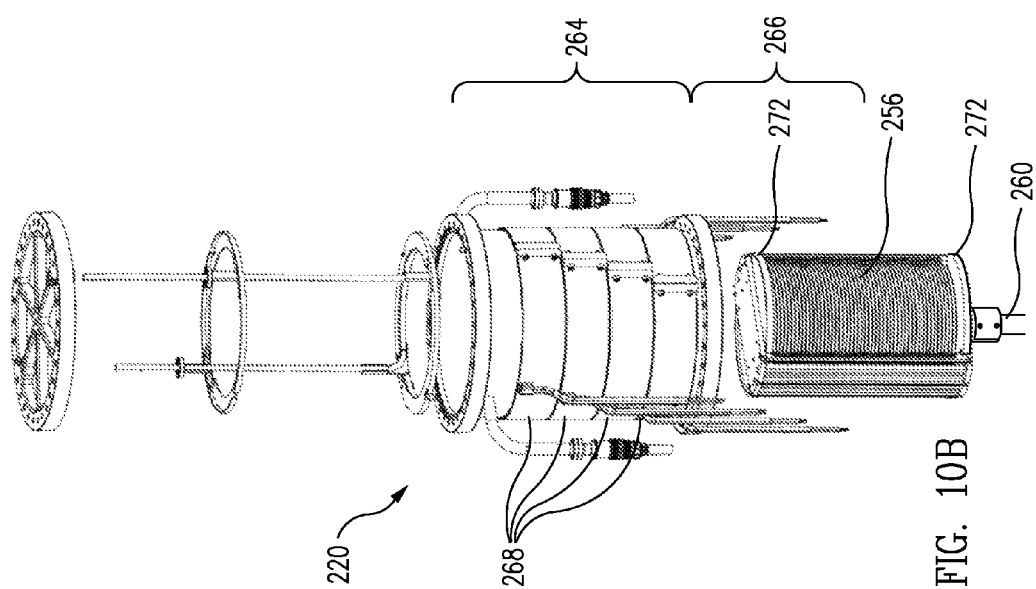
FIG. 10B is a partial top and side exploded perspective view of the bake out module.

FIG. 10A is a partial broken away top and side perspective view of an example embodiment of one of the bake out modules 220 of the WLP apparatus 200, and FIG. 10B is a partial top and side exploded perspective view thereof. FIG. 10C is another partial broken away top and side perspective view of the bake out module 220. As discussed above, research has shown that the responsivity of WLP IR detector packages can be improved by "prebaking" the individual wafers (particularly the bolometer wafer) of the packages so as to degas them as much as practically possible before they are bonded together. Accordingly, the example WLP apparatus 200 can include two bake out modules 220, one of which can be dedicated exclusively to lid or lid wafers, and the other of which can be dedicated to bolometer wafers. Accordingly, each bake out module 220 can be configured to prebake its corresponding wafer load according to a selected time/temperature/vacuum profile that can be different from that of the other. For example, in one embodiment, the bake out module 220 can be capable of prebaking its load of wafers at a temperature at or above the final baking temperature, for a desired period of time, and within a UHV environment.

As illustrated in FIGS. 10A-10C, in a manner similar to the lock load module 216 described above, the bake out module 220 can include a vertically movable cassette 256 that is capable of holding multiple wafers or bonded wafer pairs. Vertical movement of the cassette 256, e.g., for the loading and unloading of wafers from the cassette 256, can be effected with an elevator 258 having a vertically movable shaft 260 coupled to the cassette 256. The vertical position of the cassette 258, and hence, the individual wafers therein, relative to the openings in the associated slot valve 226 can be precisely controlled using, for example, a cassette positional sensor 262, e,g., a laser sensor. The positional sensor 262 can be used to precisely align any one of the wafers or bonded wafer pairs in the cassette 256 with the end effector 244 of the wafer handling robot 242 of the central chamber 218.

As illustrated in FIGS. 10 A and 10B, the bake out module 220 can comprise a hollow, generally cylindrical chamber having two sections, viz., an upper or baking section 264 and a lower or wafer loading and unloading section 266. The upper section 264 can be provided externally with heating jackets 268 to heat the contents therein, and a thermally insulating blanket 270 overlying the heating jackets 268 to prevent heat loss therefrom. Additionally, as illustrated in FIGS. 10B and 10C, the wafer cassette 256 can be provided with a heated "heat mirror," e.g., a copper plate 272, at one or both of the upper and/or lower ends of the cassette 256 to slow heating and/or cooling of the end wafers in the cassette 256 and to prevent loss of heat from the upper section 264 to the lower section 266. As a result, when the cassette 256 is disposed in the upper section 264 of the bake out module 220, the wafers contained therein can be maintained at a desired baking temperature, with a temperature uniformity of about +−5 degrees Celsius. As in the load lock module 216 and the central chamber 218 above, one or more cryopumps 274 can be coupled to the bake out module 220 through a gate valve 276 to provide a suitable UHV environment therein during the bake out process. Additionally, the gate valve 276 can be provided with a heat baffle to prevent heat loss from the bake out module 220 that might otherwise be leaked out through the cryopump 274.

Figure 11B:
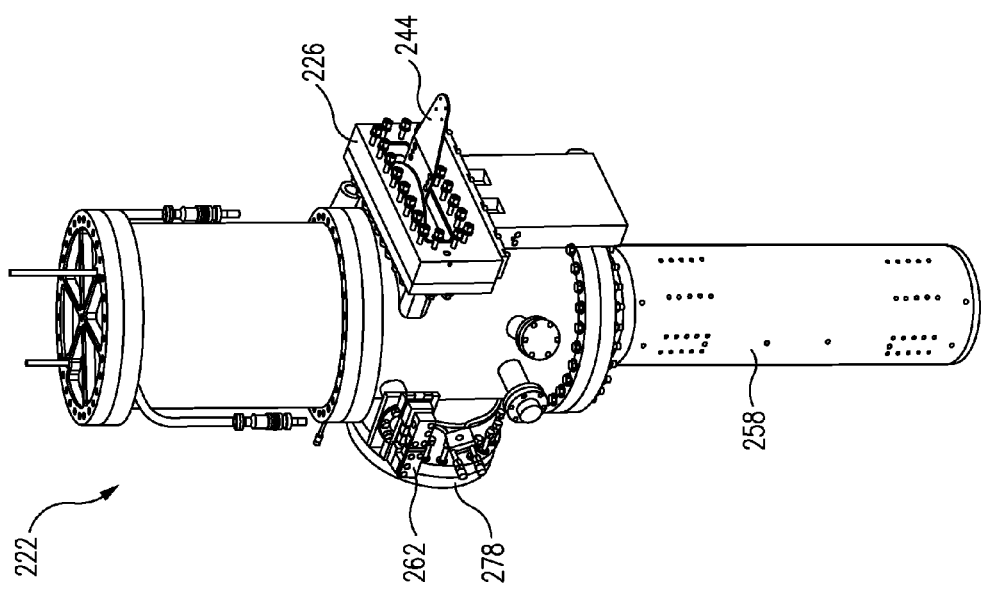
FIGS. 11A and 11B are side elevation and top and side perspective views, respectively, of an example embodiment of a buffer module of the WLP apparatus.
Figure 11A:
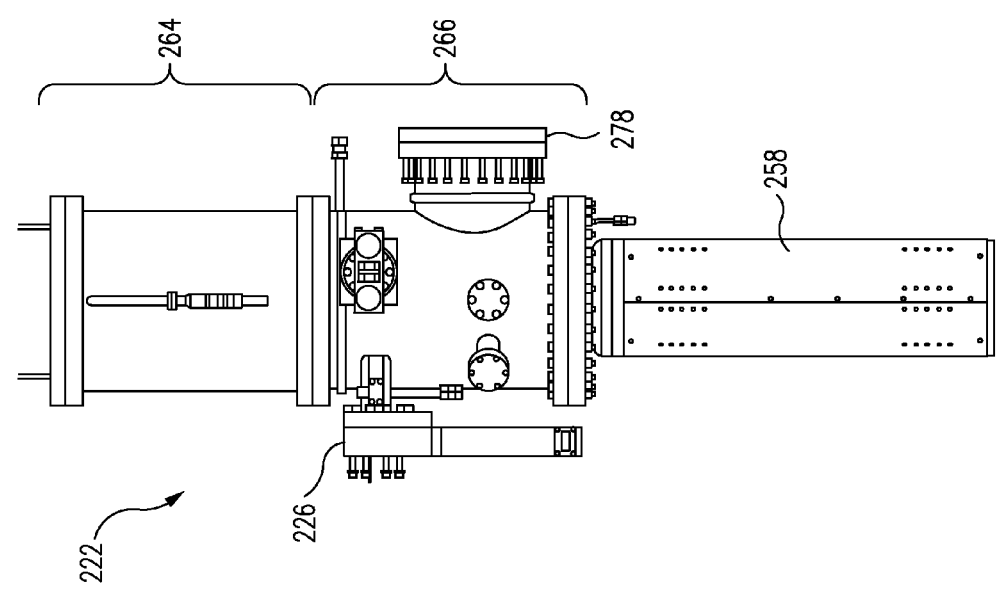

FIGS. 11A and 11B are side elevation and top and side perspective views, respectively, of an example embodiment of one of the two buffer modules 222 of the WLP apparatus 200. The function of the buffer module 222 is to temporarily store or hold wafers, i.e., lid wafers and bolometer wafers, that have previously been baked out in respective ones of the above bake out modules 220 and prior to their insertion (via the wafer handling robot 242 of the central chamber 218) into the alignment and bonding module 224 for pre-bonding alignment of the wafers and their subsequent bonding. Additionally, if desired, they can also be used to temporarily store or hold bonded wafer pairs after they have been bonded in the alignment and bonding module 224.

Accordingly, as illustrated in FIGS. 11A and 11B, the buffer modules 222 can be configured to be substantially similar to the bake out modules 220, i.e., to include a wafer cassette (not visible in FIGS. 11A, 11B) that is vertically movable between a upper or wafer storage chamber section 264 and a lower or wafer loading and unloading chamber section 266 by means of an elevator 258. Indeed, the buffer modules 222 can advantageously be configured to use the same components as the bake out modules 220, with the exception that they can be ported for, but need not be equipped with, individual cryopumps 274. Thus, in some embodiments, the buffer modules 222 can easily be converted to a bake out module 220 by equipping them with a port 278 that is configured to receive a gate valve 276 and a cryopump 274.

FIGS. 12A and 12B are a top and side perspective view and a partial broken away top and side perspective view, respectively, of an example embodiment of the novel wafer alignment and bonding module 224 of the WLP apparatus 200. As illustrated in the figures, the wafer alignment and bonding module can comprise a hollow, generally cylindrical chamber 280 that communicates with the central chamber 218 through an associated UHV slot valve 226. In the particular embodiment illustrated, the chamber 218 can be provided with, for example, a pair of cryopumps 284 that respectively communicate with it through associated slot valves 286, and which are capable of evacuating the chamber to UHV pressures. Preferably, the diameter and height of the chamber 218 are the minimum necessary to mount the cryopumps 284 required to achieve this UHV level, all seals are metal, and construction is of 304 L stainless steel or equivalent, that is electro-polished internally, and/or in which all surfaces have otherwise been finished for minimum absorptivity, and the like.

In FIG. 12B, the side walls of the chamber 280 of the alignment and bonding module 224 are omitted to show a pair of electrostatic wafer clamps (ESCs) and various portions of a wafer bonding system, described in more detail below, viz., a upper, or lid wafer chuck 288, and a lower, or bolometer wafer chuck 290, which are respectively used in the example wafer bonding method described below to manipulate the lid and bolometer wafers within the alignment and bonding module 224. Additionally, the alignment and bonding module chamber 280 is provided with a pair of opposing ports 292 through each of which a corresponding one of a pair of dual head alignment cameras described below can be extended into and retracted from the chamber 280.

Figure 14:
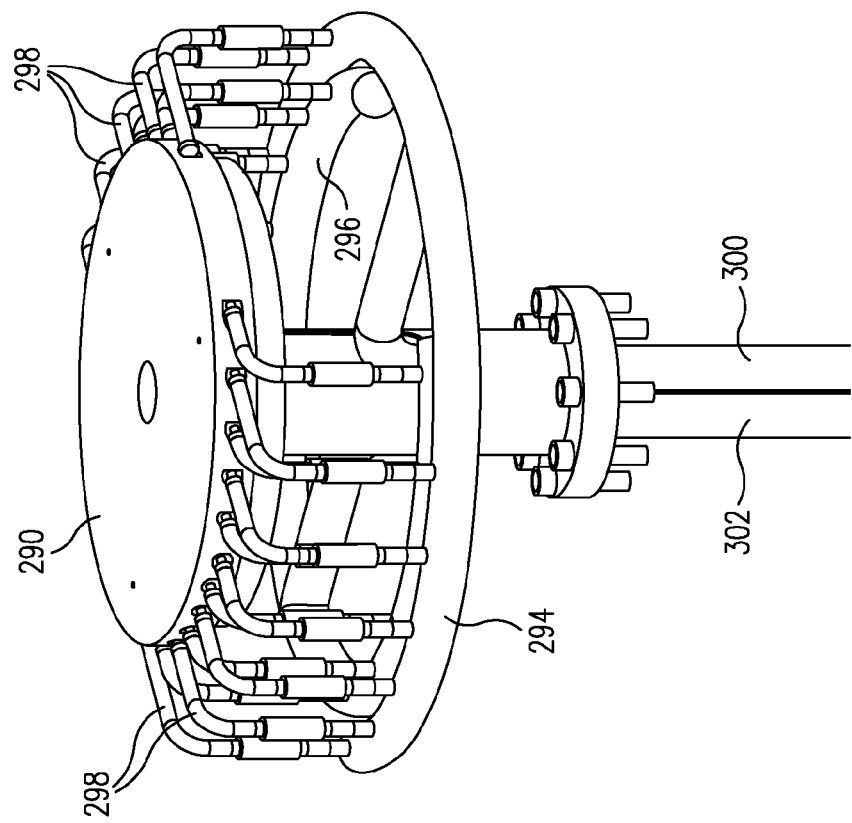
FIG. 14 is a top and side perspective view of an example embodiment of bolometer wafer chuck of the alignment and bond module of FIGS. 12A and 12B.
Figure 13:
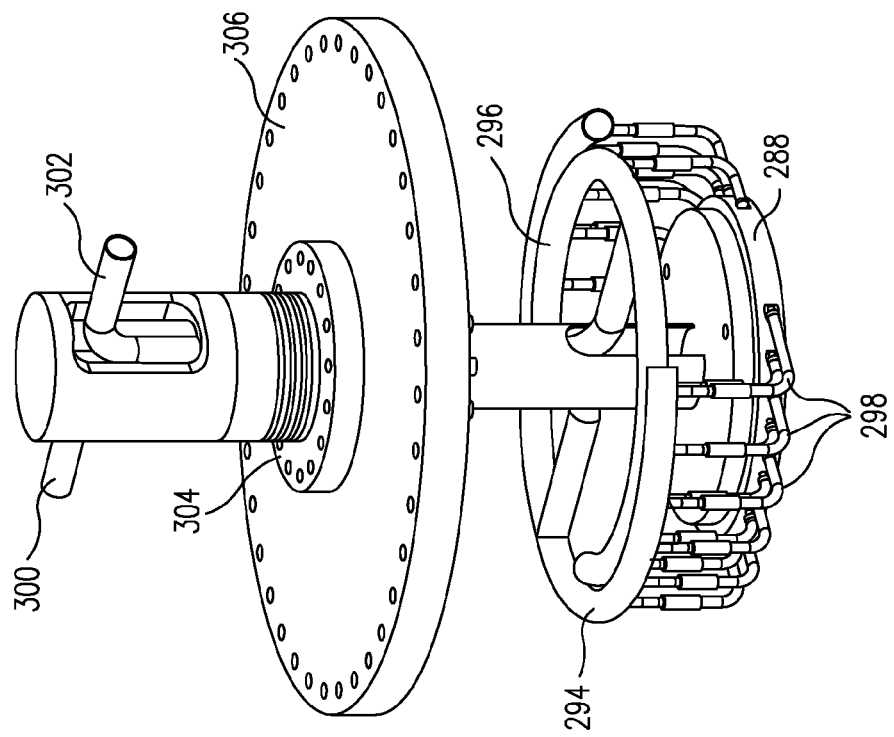
FIG. 13 is a top and side perspective of an example embodiment of a lid wafer chuck of the alignment and bond module of FIGS. 12A and 12B.
Figure 15:
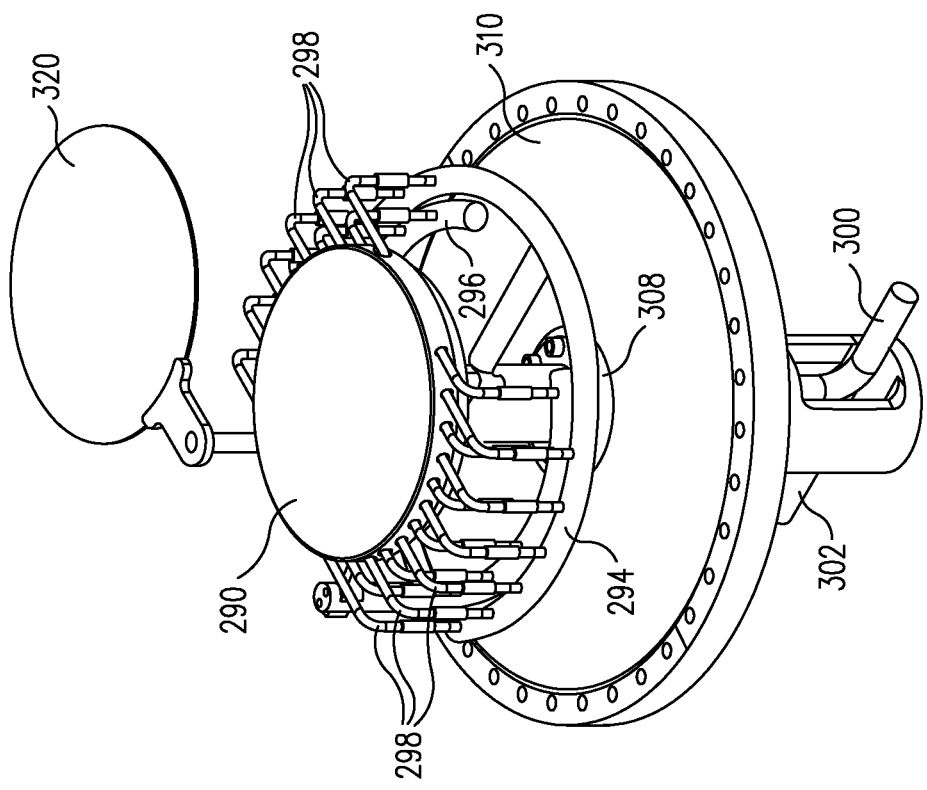
FIG. 15 is a bottom and side perspective view of the lid wafer chuck of FIG. 13, showing a horizontally movable thermal shield disposed adjacent to the chuck in accordance with an embodiment.

FIG. 13 is a top and side perspective of the upper or lid wafer chuck 288 of the alignment and bond module 224, and FIG. 14 is a top and side perspective view of the lower or bolometer wafer chuck 290 thereof. As described in more detail below, in the example embodiment described herein, the temperature of each of the wafer chucks 288 and 290, and hence, the wafer respectively mounted thereon (e.g., and/or including various ESCs), can be independently heated using a circulated gas, e.g., air, that is appropriately heated or cooled. To effect this, each of the chucks 288 and 290 is provided with associated inlet and outlet manifolds 294 and 296, each of which is respectively coupled to the associated chuck 288 or 290 with a plurality of individual gas conduits 298. Each of the inlet manifolds 294 is fed by an associated gas inlet conduit 300, and each of the outlet manifolds 286 is exhausted by an associated gas outlet conduit 302. As illustrated in FIG. 13, both the heating and cooling gas inlet and outlet 300 and 302 of the lid wafer chuck 288 can be introduced into the chamber 280 of the alignment and bonding module 224 through a sealed central opening 304 in an upper closure plate 306 of the chamber 280, and as illustrated in FIG. 15, the heating and cooling gas inlet and outlet 300 and 302 of the bolometer wafer chuck 290 can be introduced into the chamber 280 of the alignment and bonding module 224 through a sealed central opening 308 in a lower closure plate 310 of the chamber 280.

Figure 18A:
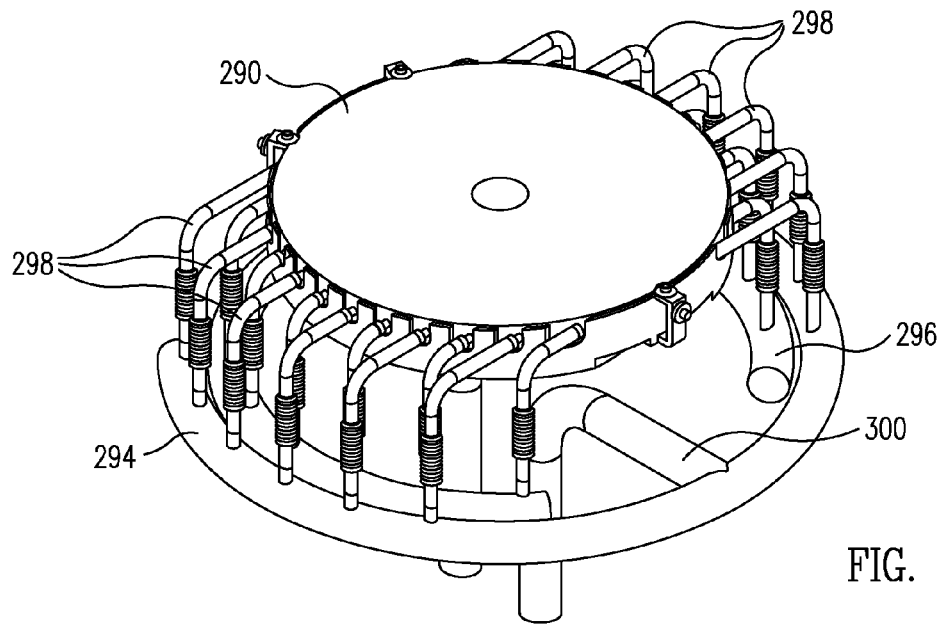
FIGS. 18A and 18B are a top and side perspective view and a bottom and side perspective view of the bolometer wafer chuck, respectively, in accordance with an embodiment.
Figure 18B:
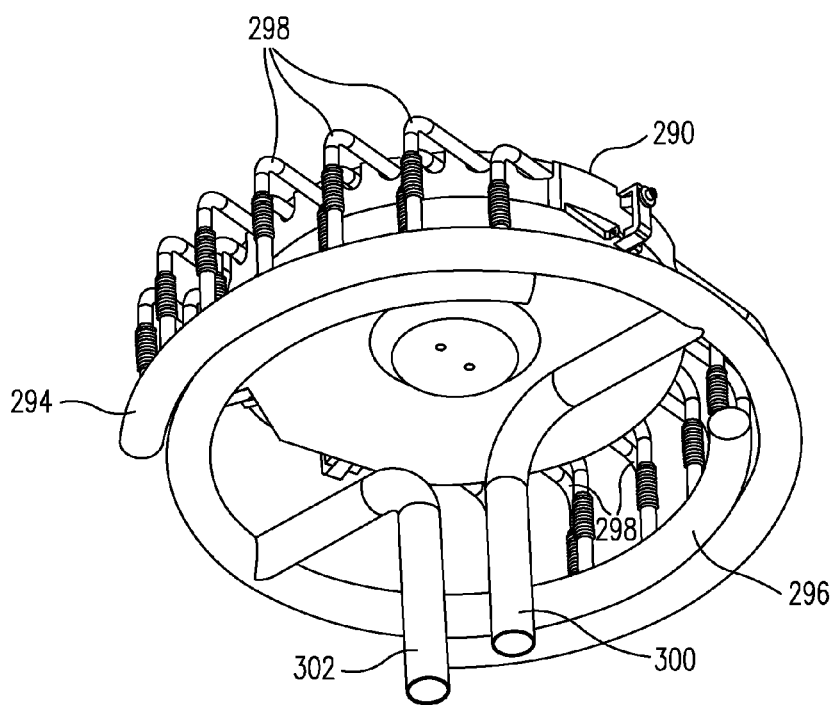
Figure 19:
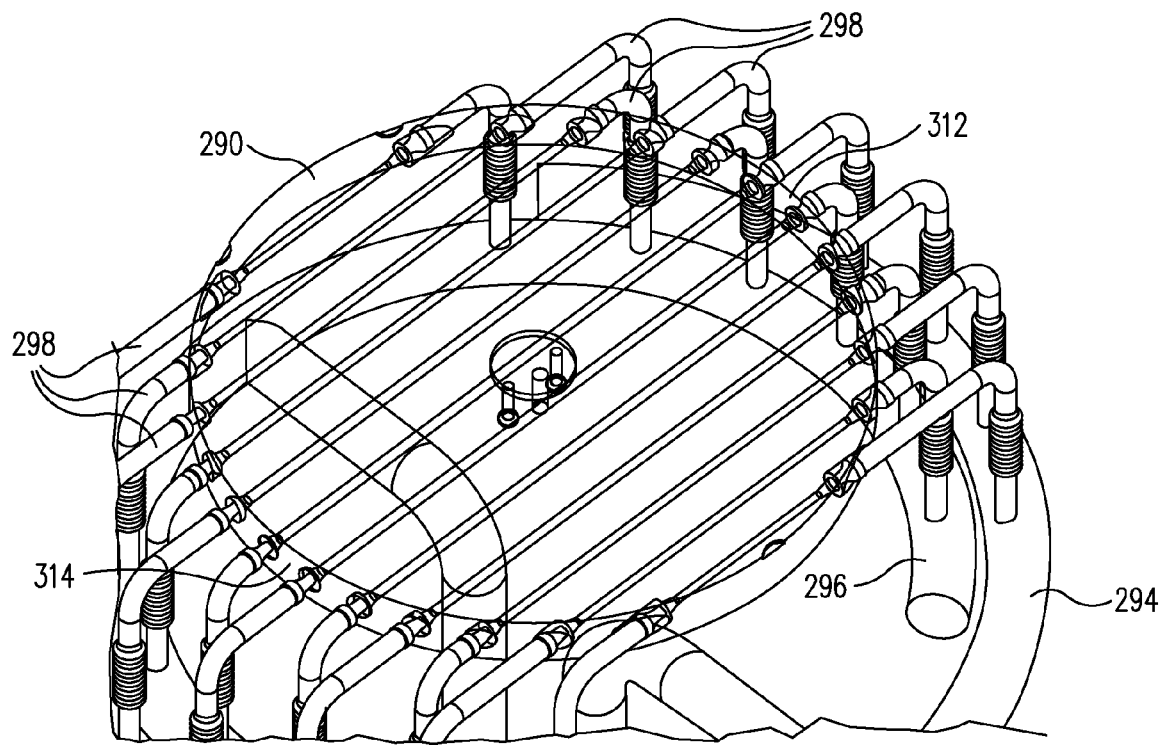
FIG. 19 is a partial upper perspective view of the bolometer wafer chuck, illustrated as if it were transparent to show heating and cooling fluid passageways extending through it in accordance with an embodiment.

FIGS. 18A and 18B are a top and side perspective view and a bottom and side perspective view of the bolometer wafer chuck 290, respectively, showing the various heating and cooling gas inlet and outlet manifolds 294 and 296, individual gas conduits 298, and gas inlet and outlets conduits 300 and 302 associated therewith. FIG. 19 is a partial top and side view of the bolometer wafer chuck 290, in which the chuck 290 is rendered partially transparent to show the direct circulation of the heating or cooling gas through the chuck 290 from an inlet side 312 of the chuck to an outlet side 314 of the chuck via the individual gas conduits 298. As those of some skill will recognize, this arrangement comprises a "single pass" system that results in a relatively uniform distribution of temperature in the chuck 290, and hence, an associated bolometer wafer mounted thereon. Not illustrated in the figures are the well-known types of electrodes and electrode controls provided on top of the chuck 290 to provide an electrostatic charge of a force of sufficient magnitude to hold the associated wafer firmly on its upper surface. As should be understood, the heating and cooling and electrostatic charging arrangement of the lid or lid wafer chuck 288 can be made substantially similar to that of the bolometer wafer chuck 290.

Figure 20:
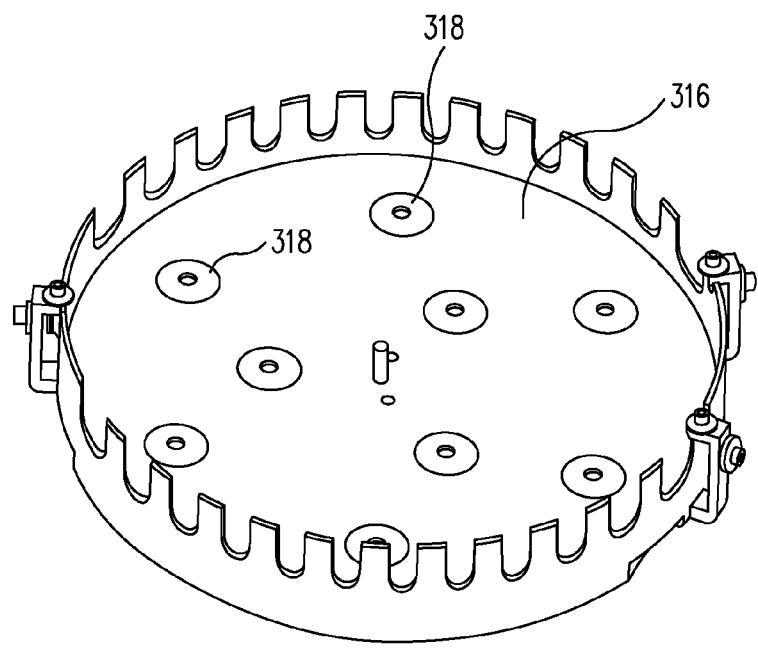
FIG. 20 is a top and side perspective view of a support pan for supporting a lower surface of the bolometer wafer chuck or an upper surface of the lid wafer chuck, showing Belleville spring compliance mounts for the corresponding wafer, in accordance with an embodiment.

FIG. 20 is a top and side perspective view of a support pan 316 that can be used in some embodiments for supporting a lower surface of the bolometer wafer chuck 290 (or an upper surface of the lid wafer chuck 288), showing Belleville spring compliance mounts 318 for the corresponding wafer. The compliance provided by the mounts 318 provides for allowance of parallelism misalignment between the two chucks during the wafer bonding process described in more detail below.

In some embodiments, the thermal wafer chucks 288 and 290 which have electrostatic clamps incorporated therein can comprise, for example, oxygen-free, high-conductivity (OFHC) copper (Cu) or Aluminum Nitride (AlN). Preferably, the material of the plumbing fittings for the individual gas conduits 298, which can be brazed to the chuck 298 or 290, should have a CTE that is close to that of the chuck material as possible. For example, if the chuck comprises AlN, the plumbing fittings can comprise 42% Nickel/Iron alloy, and in the case of OFHC copper, the fittings can comprise 304 stainless steel for a reasonably close CTE match.

Figure 16:
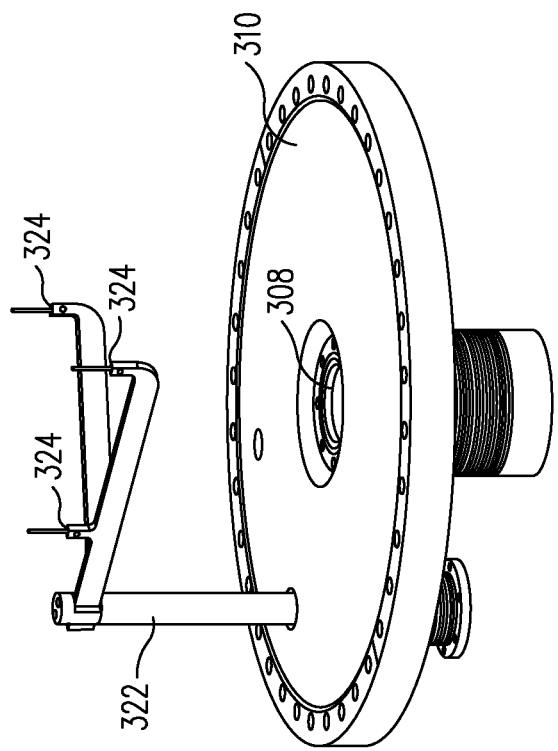
FIG. 16 is a top and side perspective view of a lower end plate of the wafer alignment and bond module, showing a vertically movable wafer lifting pin arm extending therethrough in accordance with an embodiment.

As illustrated in FIG. 15, the alignment and bonding module 224 can further include a retractable radiation shield 320 that can be moved to a position between a lid wafer and a bolometer wafer during pre-bonding heating of the wafers in the module so as to prevent radiant heating of the lid wafer by the bolometer wafer, and then retracted from between the two wafers during wafer bonding. As illustrated in FIG. 16, in some embodiments, the alignment and bonding module 224 can include a vertically movable push rod 322 that extends through the lower cover plate 310 of the module. The push rod 322 can include a pair of horizontal arms defining three lifting pins 324 having respective upper tips configured to lie in a common horizontal plane, and which are respectively disposed in corresponding apertures in the lower or bolometer wafer chuck 290 at its outer periphery. Upward movement of the push rod 322 causes the tips of the lifting 324 pins to engage the underside of a bolometer wafer disposed on the bolometer wafer chuck 290, and to lift the wafer up from the upper surface of the chuck so that, for example, the wafer can be grasped by the end effector 244 of the central chamber's wafer handling robot 242.

Figure 17B:
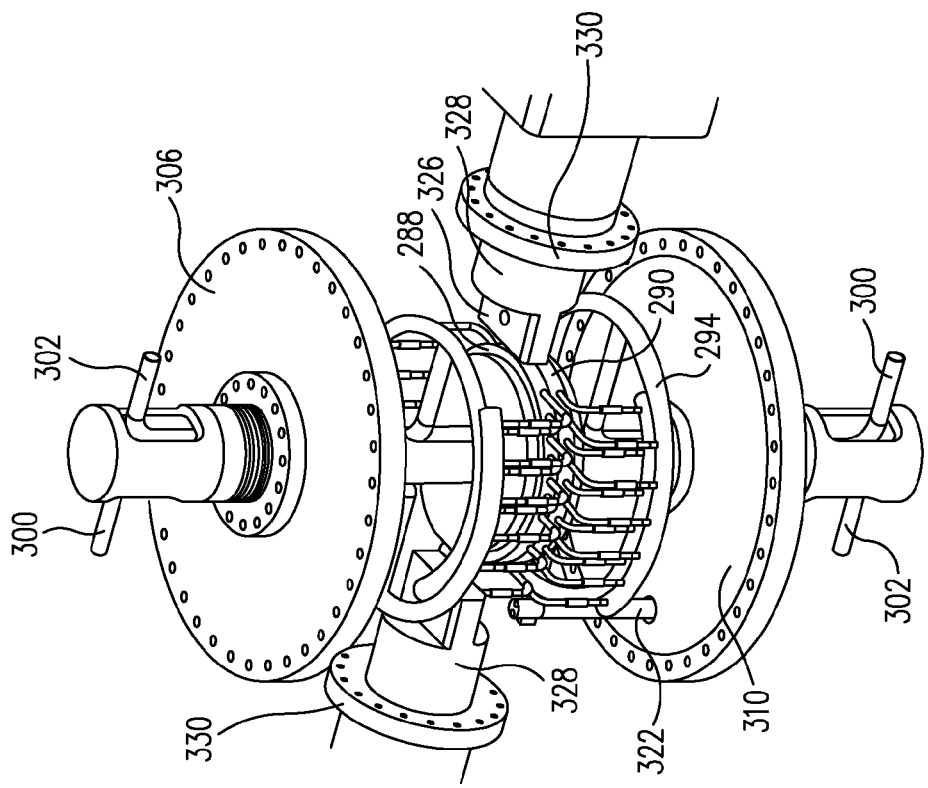
FIGS. 17A and 17B are partial broken away perspective views of the alignment and bond module, showing two dual head wafer alignment cameras respectively disposed in a wafer fiducial measurement position and a retracted position in accordance with an embodiment.
Figure 17A:
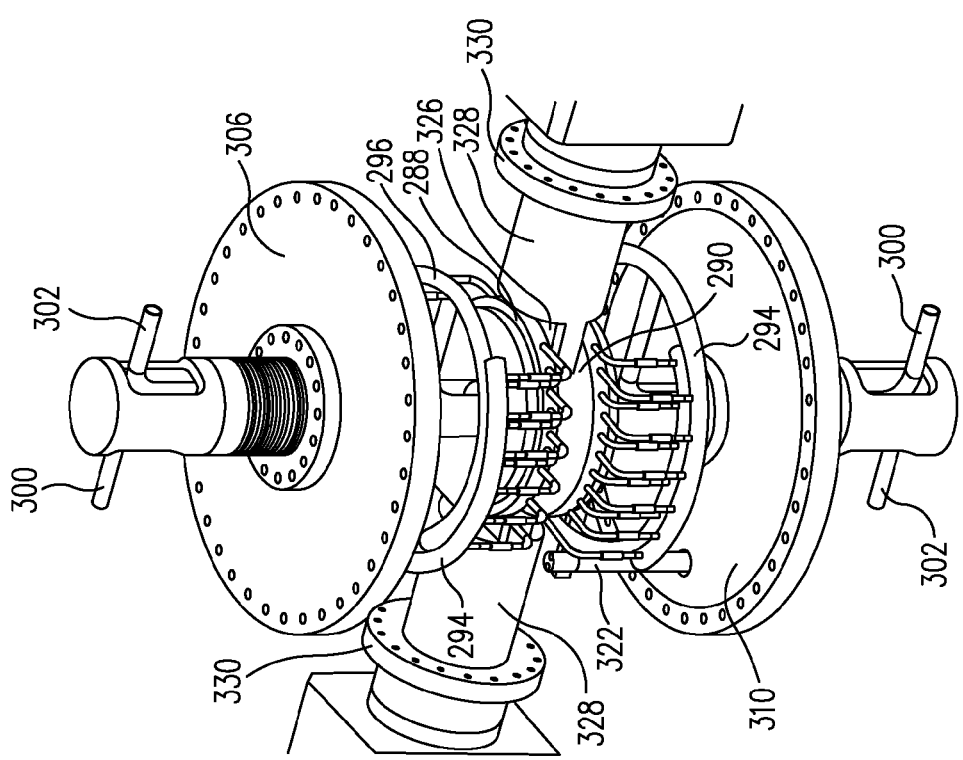

As discussed above in connection with FIGS. 12A and 12B, the chamber 280 of the alignment and bonding module 224 can be provided with a pair of opposing ports 292 through each of which a corresponding one of a pair of dual head wafer alignment cameras can be extended into and retracted from the chamber 280. FIGS. 17A and 17B are partial perspective views of the alignment and bond module 220, in which the side wall of the chamber 280 has been omitted, to show the two dual head wafer alignment cameras 326 disposed in a wafer fiducial measurement position located between the two wafers, and in a position retracted from between them, respectively. Each camera 326 is located at the end of a laterally movable boom 328 that is provided with a flange 330 configured to sealingly mate with a flange disposed on a corresponding one of the opposing ports 292 above. Each of the two cameras 326 is capable of looking both up and down, i.e., at a lower facing, or mating surface, of a lid wafer and an upper facing, or mating surface on a bolometer wafer.

As illustrated in FIG. 17A, when the opposing lid and bolometer wafer are spaced apart vertically, the two opposing cameras 326 can be urged toward each other, between the opposing wafers, and into a wafer alignment measuring position. The cameras 326 are operable to determine the positions of "fiducials" formed on the respective opposing surfaces of the wafers, and discussed below, the lower, or bolometer chuck 290 is operable to move the bolometer wafer both in the X and Y directions, i.e., laterally, and in a $\theta_z$ direction, i.e., rotationally about a Z axis perpendicular the X and Y axes, until the fiducials on the opposing surfaces of the two wafers are precisely aligned with each other for bonding. After the two wafers have been aligned for bonding using the two cameras 326, the cameras can be retracted laterally from between the two wafers, so that the two wafers can then be pressed together for bonding, as illustrated in FIG. 17B.

Figure 21A:
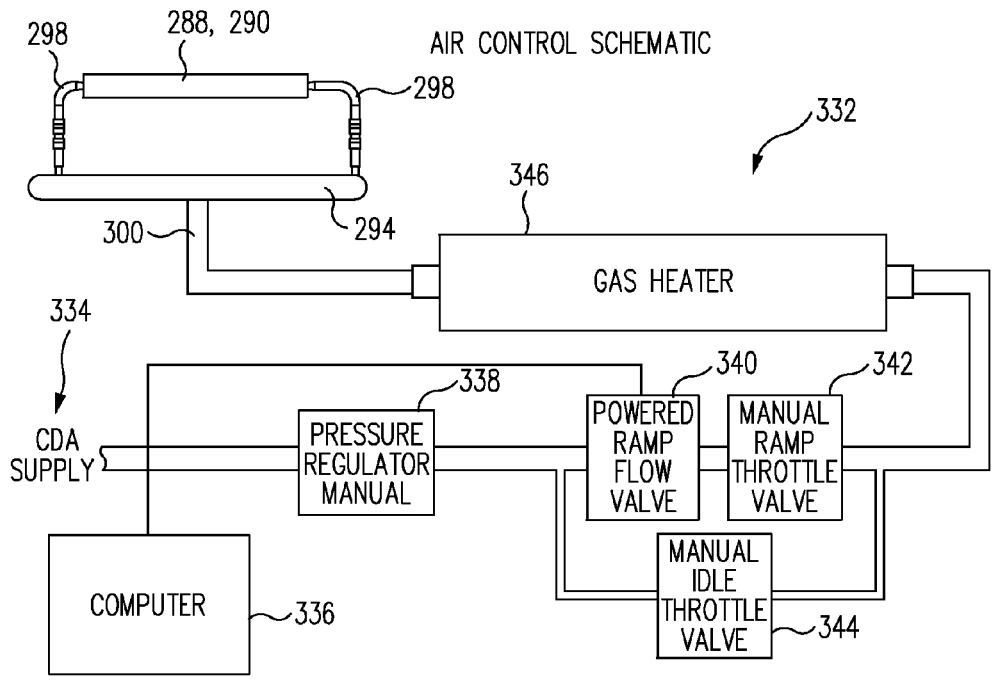
FIG. 21A is a schematic diagram illustrating an example embodiment of an arrangement for controlling the flow and temperature of heating and cooling air through the lid wafer chuck and/or the bolometer wafer chuck of the WLP apparatus in accordance with one or more embodiments of the present invention.

FIG. 21A is a schematic diagram illustrating an example embodiment of an apparatus 332 for controlling the flow rate and temperature of the heating and cooling gas, e.g., air, conveyed through the lid wafer chuck 288 and/or the bolometer wafer chuck 290 of the WLP apparatus 200, as described above. As illustrated in FIG. 21A the apparatus 332 can include a supply of clean dry air (CDA) 334 and a computer 336, e.g., a PC, for controlling both the flow rate and temperature of the air supplied to the wafer chucks 288, 290. The elements for controlling the rate of flow of the cooling and heating air can include a manually controlled pressure regulator 338, a computer-controlled powered ramp flow valve 340, a manually controlled ramp throttle valve 342, and a manually controlled idle throttle valve 344. The elements for controlling the temperature of the air can include, for example, an electric gas heater 346.

Figure 21B:
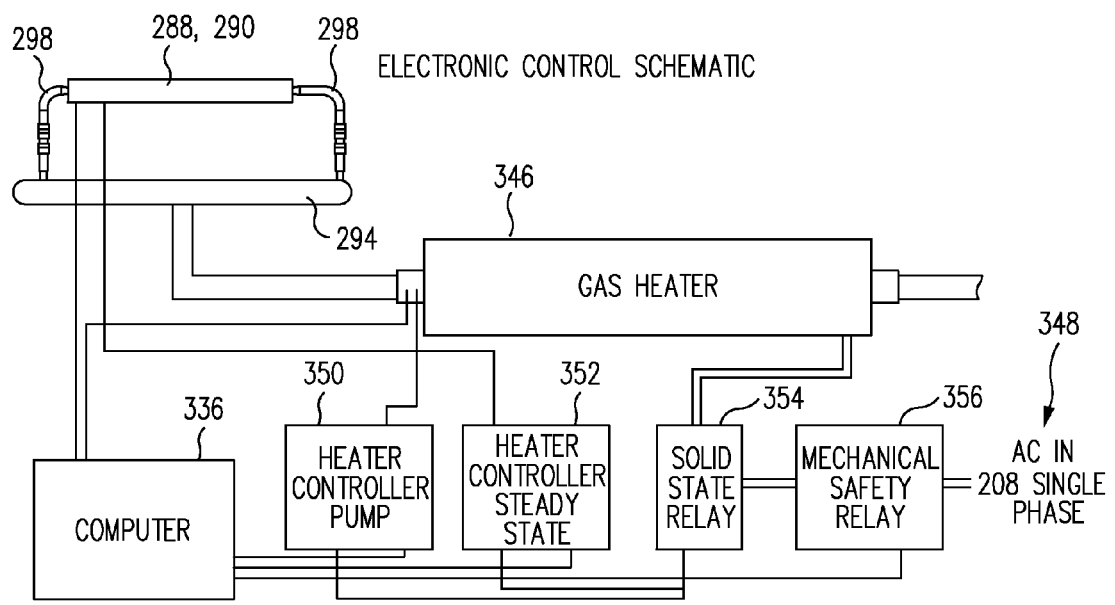
FIG. 21B is a schematic diagram similar to FIG. 21A, showing an example embodiment of an arrangement for controlling and distributing electronic power and control signals of the WLP apparatus in accordance with one or more embodiments of the invention.

FIG. 21B is a schematic diagram similar to FIG. 21A, showing an example embodiment of an arrangement for controlling and distributing electronic power and control signals of the control apparatus 332 of FIG. 21A. As illustrated in FIG. 21B, the electronic power and control signal elements of the controller 332 can include, besides the same control computer 336 described above, a supply of regulated electrical power 348, e.g., 208 VAC, single phase, a ramp heater controller 350, a steady state heater controller 352, a solid state relay 354 that used to control, e.g., the power to the heater 346 and a mechanical safety relay 356.

As discussed above, the respective temperatures of the wafer chucks 288, 290 are driven by hot (for heating) or ambient temperature (for cooling) CDA. This pressure can be appropriately varied to adjust air density, and therefore, the heating/cooling rate of the chucks 288, 290. Air heating can be effected using a commercially available gas heater 346 comprising electrical resistance heating elements, which are easily controllable by either a PC and/or a conventional heater controller. The heating system thus described has 2 modes, viz., a "high power" mode for rapid ramping up of the temperatures of the chucks 288, 290, and a "low power" mode for maintaining the respective chuck temperatures once they are reached. During the high power mode, the temperature of the air is maintained at a constant temperature differential from those of the wafer chucks 288, 290. For example, as the temperature of the chuck 288, 290 rises during a heating ramp, the temperature of the air will rise with the chuck. During cooling, the same temperature differential is maintained. This approach can control the thermal stresses in the chucks to a pre-defined limit.

Figure 22:
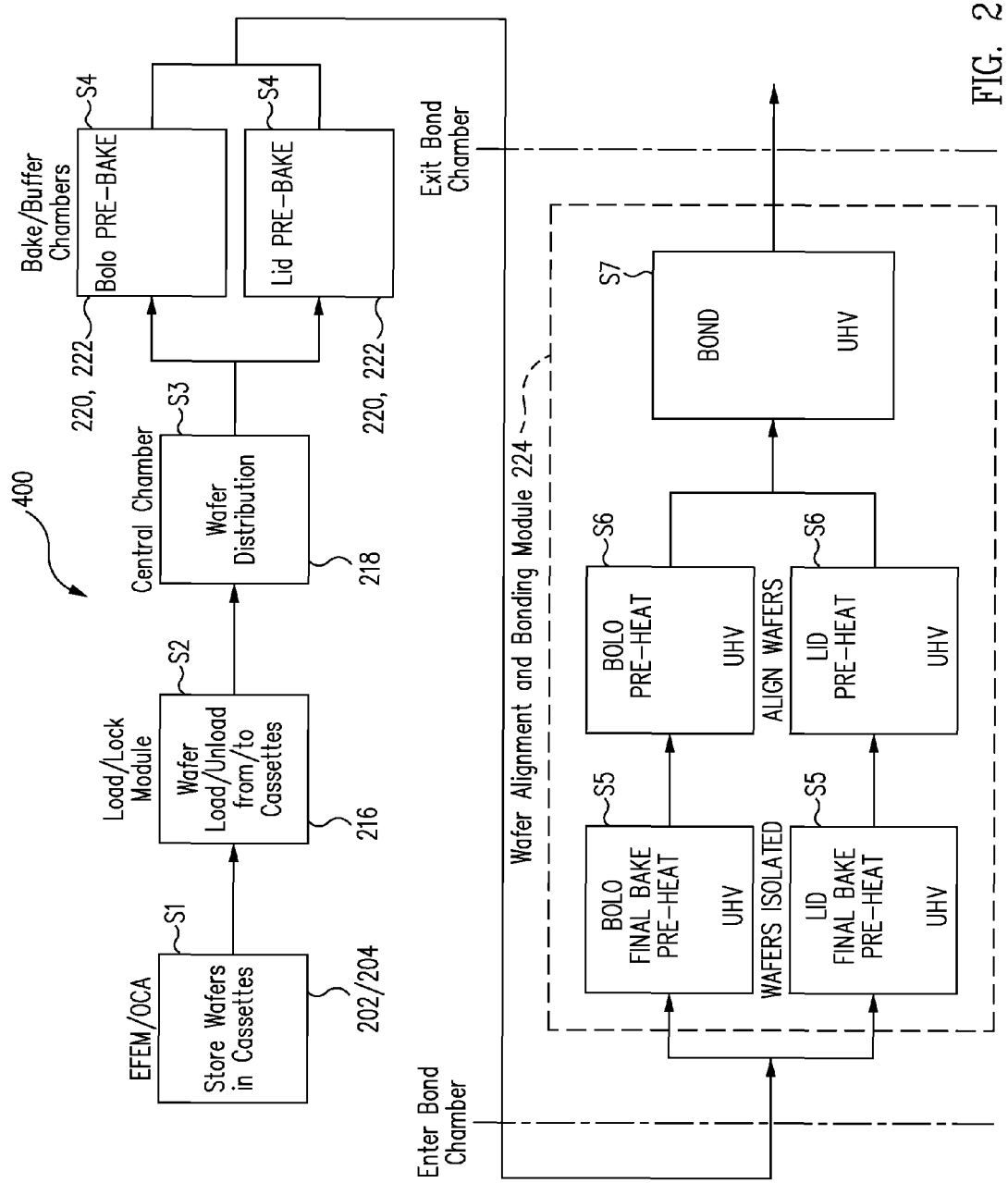
FIG. 22 is a process flow diagram of an example embodiment of a WLP method for making a microbolometer VPA in accordance with one or more embodiments of the present invention.

FIG. 22 is a process flow diagram of an example embodiment of a WLP method 400 for making a microbolometer VPA using the WLP apparatus 200 described above. As discussed above, the method 400 begins at step 1 (S1) with the storage of at least one lid wafer and at least one bolometer wafers in respective clean room wafer cassettes disposed in the Front End Module (EFEM) 202 and Open Cassette Adapter (OCA) 204. At S2, the two wafers are sequentially removed from their respective cassettes using the wafer handling robot 210 of the EFEM 202 and placed thereby in the wafer cassette 234 of the load lock module 216. At S3, the wafers are removed from the cassette 234 of the load lock module 216 by the wafer handling robot 242 of the central chamber 218 and respectively distributed thereby to the associated wafer cassette 256 of a dedicated one of the bake out modules 220, or alternatively, of a dedicated one of the buffer modules 222 where, at S4, 1) the bolometer wafer is "pre-baked" at a desired temperature for a period of time, in a UHV environment, and 2) the lid wafer is pre-baked at a desired temperature for a period of time, in a UHV environment. In accordance with an embodiment, the bolometer and lid wafers may travel through the WLP apparatus 200 using separate, different paths. For example for an embodiment, the bolometer wafers may travel from the load lock module 216 to the wafer alignment and bonding module 224 in a counter clockwise direction (through respective bake out module 220 and/or buffer module 222 on the right side of FIG. 5), while the lid wafers may travel a separate, different path from the load lock module 216 to the wafer alignment and bonding module 224 in a clockwise direction (through respective bake out module 220 and/or buffer module 222 on the left side of FIG. 5).

As further illustrated in FIG. 22, after the lid and bolo wafers have been pre-baked, they are removed from the respective wafer positions 256 of the respective bake out modules 220 or buffer modules 222 with the wafer handling robot 242 of the central chamber 218 and placed thereby inside the wafer alignment and bonding module 224 and on a corresponding electrostatic lid wafer and/or bolometer wafer chuck 288 and 290. At S5, the pressure in the wafer alignment and bonding module 224 is reduced, the radiation shield 320 is moved between the wafers, and the respective temperatures of the two wafers are adjusted, using the respective wafer chucks 288 and 290, to respective "final bake" temperatures for a relatively brief period. At S6, the radiation shield 320 is removed from between the wafers, the respective temperatures of the two wafers are raised to a pre-bonding temperature and they are precisely aligned with each other for bonding using the dual head wafer alignment cameras 326 as described above, the alignment cameras are then moved clear, and at S7, the two wafers are pressed into contact with each other using the wafer chucks 288, 290, the respective temperature of the two wafers are both raised to the bonding temperature of the wafers at which point the respective sealing mechanisms on the two wafers, for example, corresponding solder rings, reflow and join with each other to form a seal, after which the temperatures of the wafers are ramped down, or cooled rapidly, thereby permanently joining the two wafers into a single bonded wafer pair.

Figure 23:
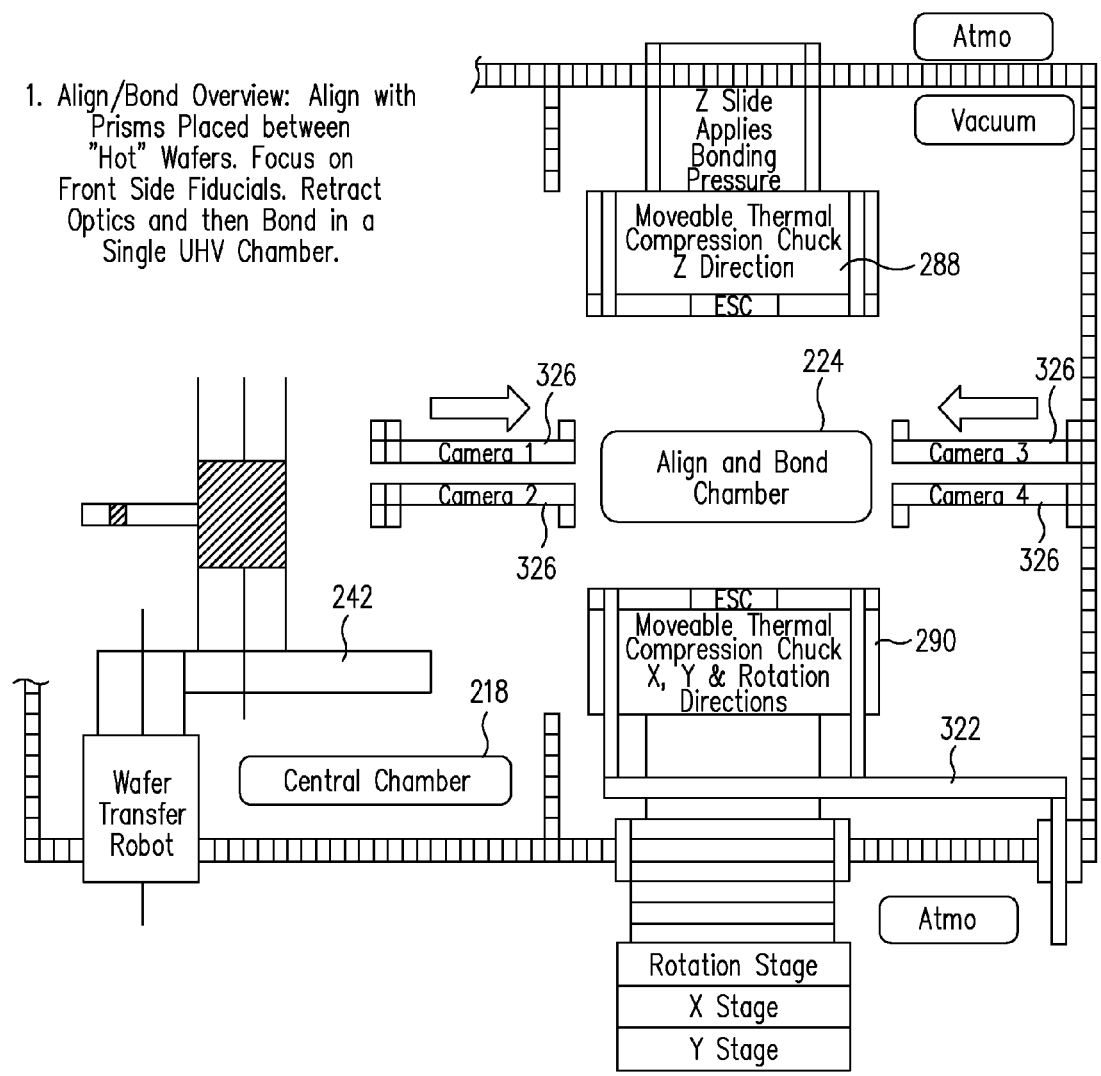
FIG. 23 is a diagram illustrating an overview of a wafer alignment and bonding process of the example WLP production method of FIG. 22 in accordance with one or more embodiments of the present invention.

FIG. 23 is a diagram illustrating an overview of the wafer alignment and bonding process carried out within the wafer alignment and bonding module 224 in steps S5-S7 of the example WLP production method 400 of FIG. 22, and FIGS. 24-37 are diagrams illustrating in more detail the steps involved in those steps.

Figure 24:
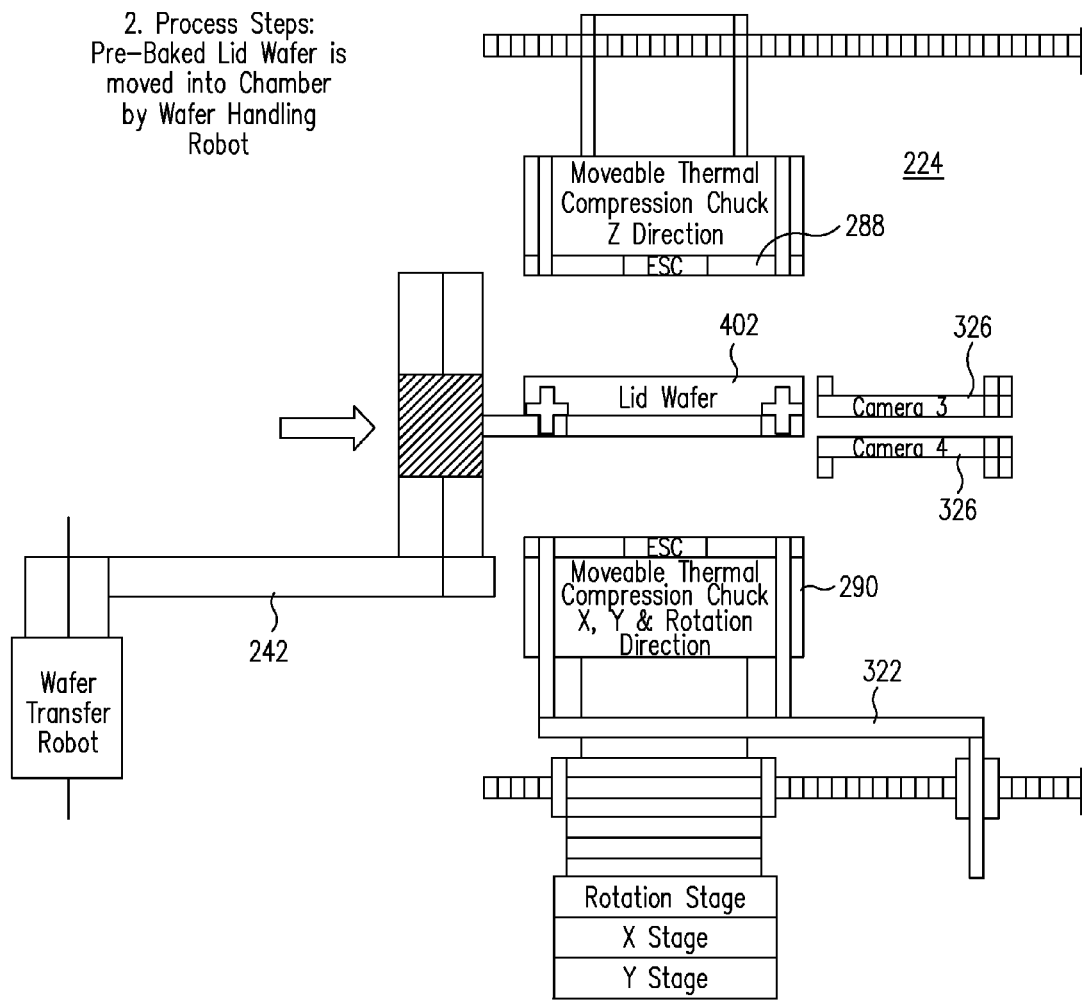
FIGS. 24-37 are diagrams illustrating sequential steps involved in the wafer alignment and bonding process of FIG. 23 in accordance with one or more embodiments of the present invention.

As illustrated in FIG. 24 and described above, a pre-baked lid wafer 402 is transferred from either a bake module 220 or a buffer module 222 into the wafer alignment and bonding module 224 by the wafer handling robot 242.

Figure 25:
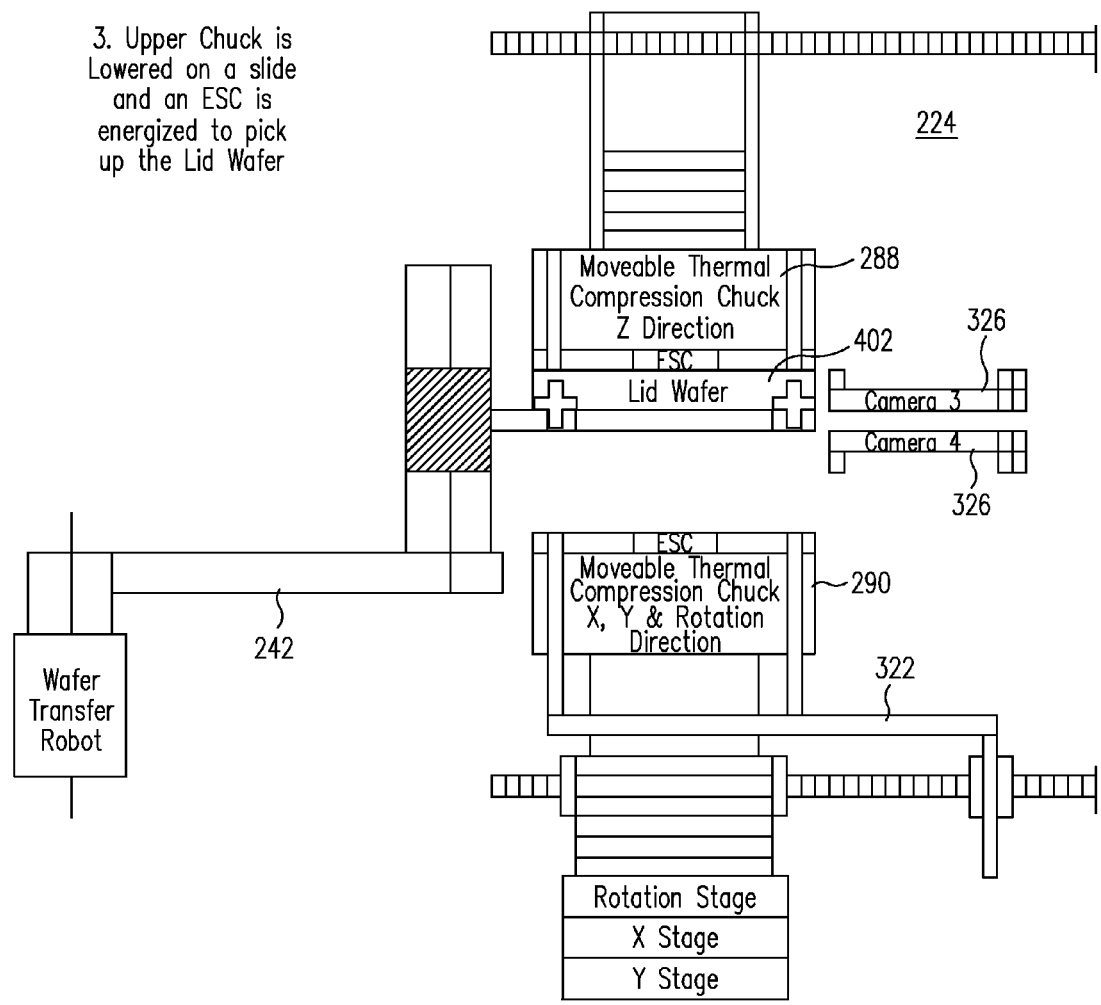

In FIG. 25, the upper, or lid wafer chuck 288 is lowered vertically, i.e., in a Z direction, into contact with the lid wafer 402 and then the ESC is energized so as to bind the wafer 402 electrostatically to the chuck assembly 288.

Figure 26:
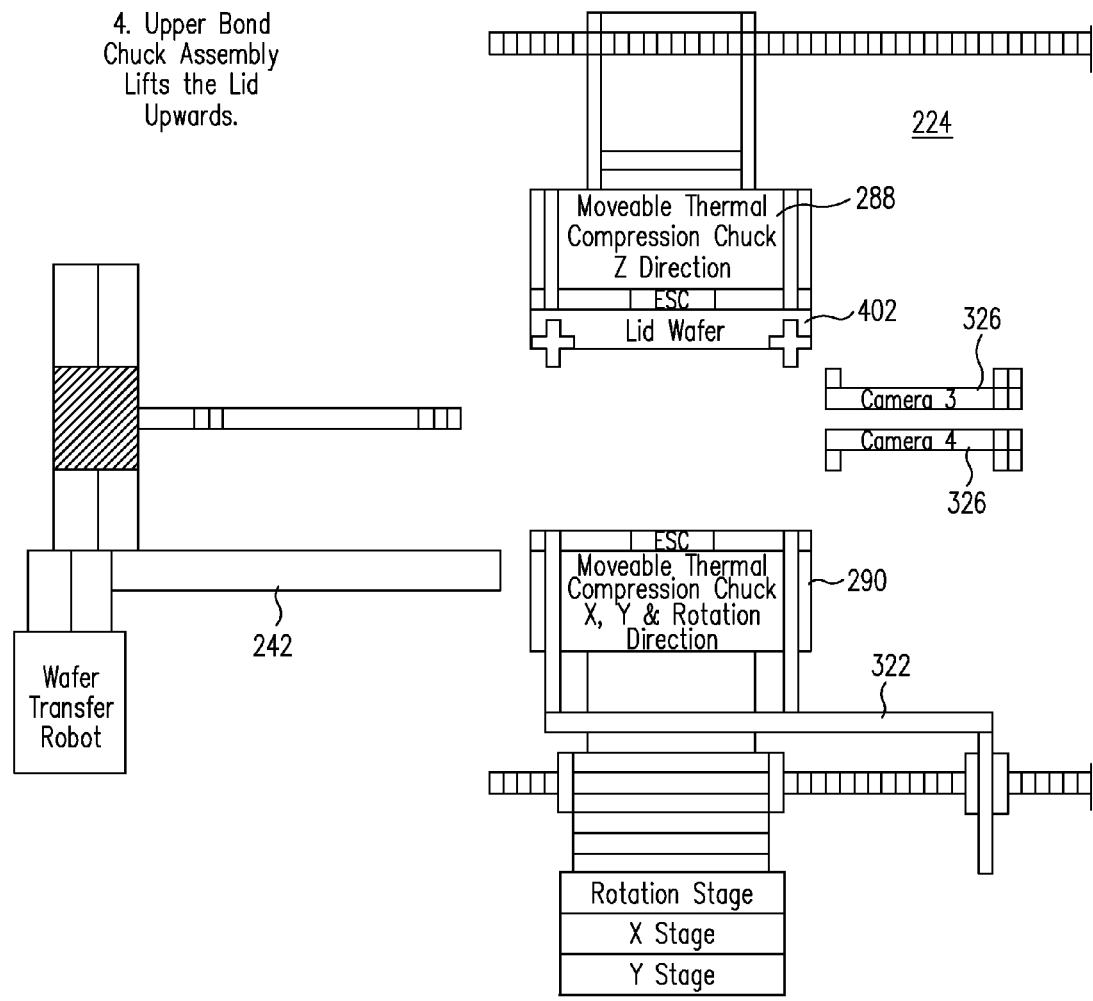

In FIG. 26, the lid wafer chuck 288 is raised vertically, lifting the lid wafer 402 along with it.

Figure 27:
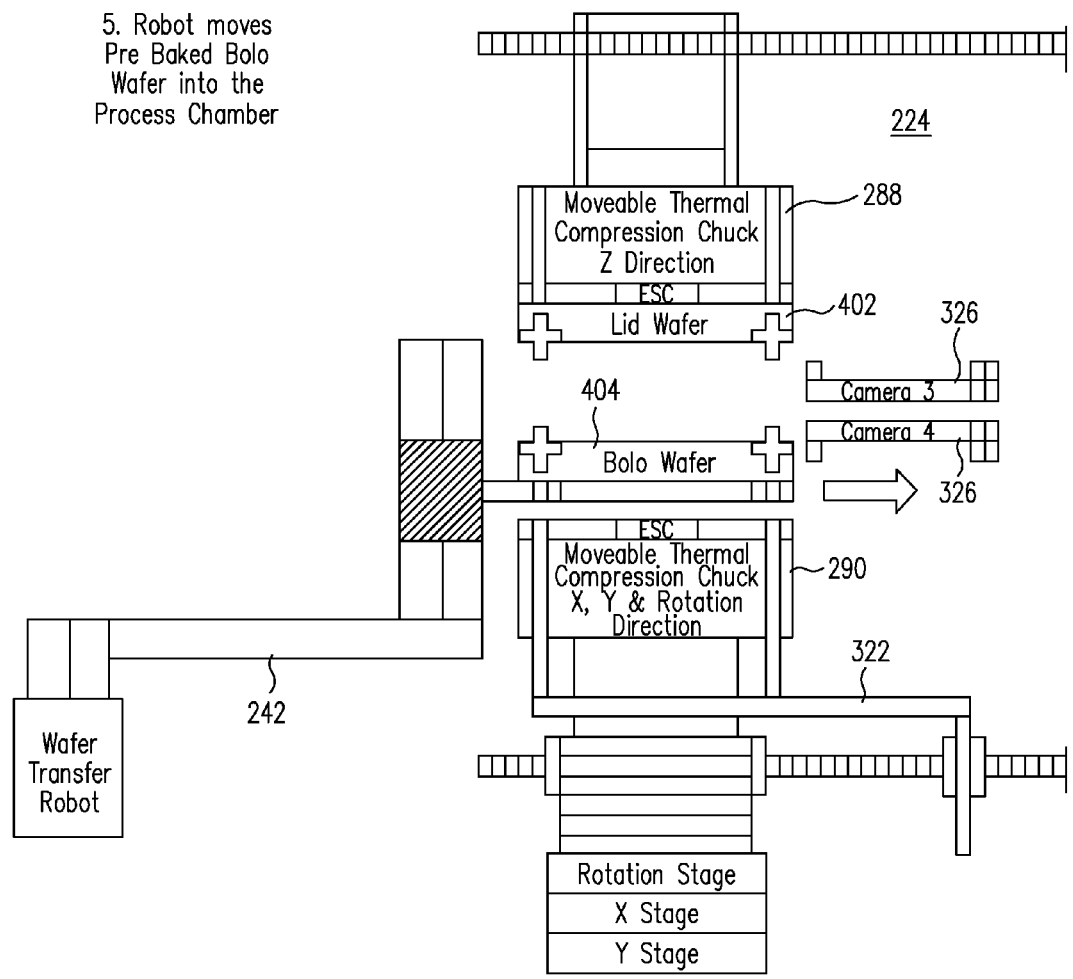

In FIG. 27, a pre-baked bolometer wafer 404 is transferred into the alignment and bonding module 224 by the wafer handling robot 242.

Figure 28:
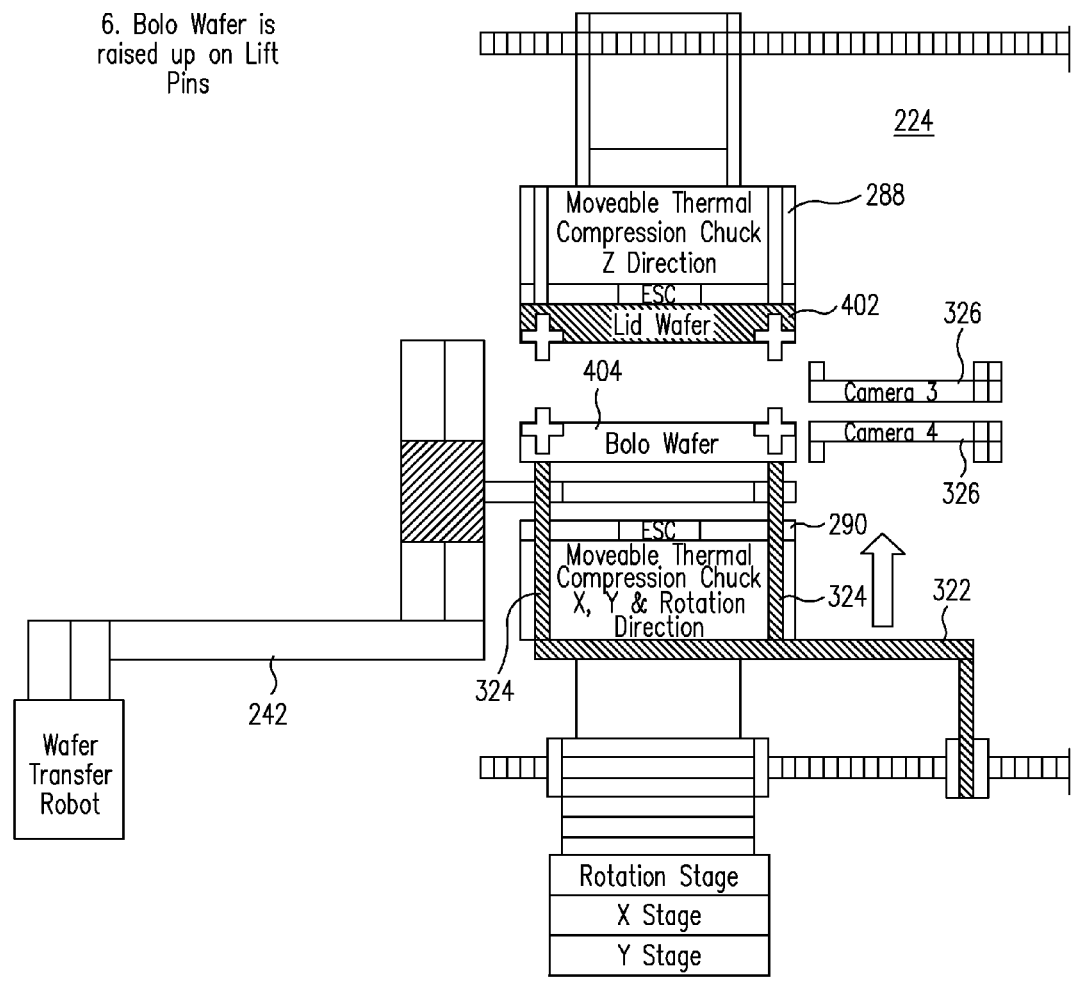

In FIG. 28, the push rod 322 is raised in the Z direction, causing the three lifting pins lifting pins 324 thereon to engage the lower surface of the bolometer wafer 404 through the bolometer wafer chuck 290 and to lift the wafer 404 off of the arm of the wafer handling robot 242.

Figure 29:
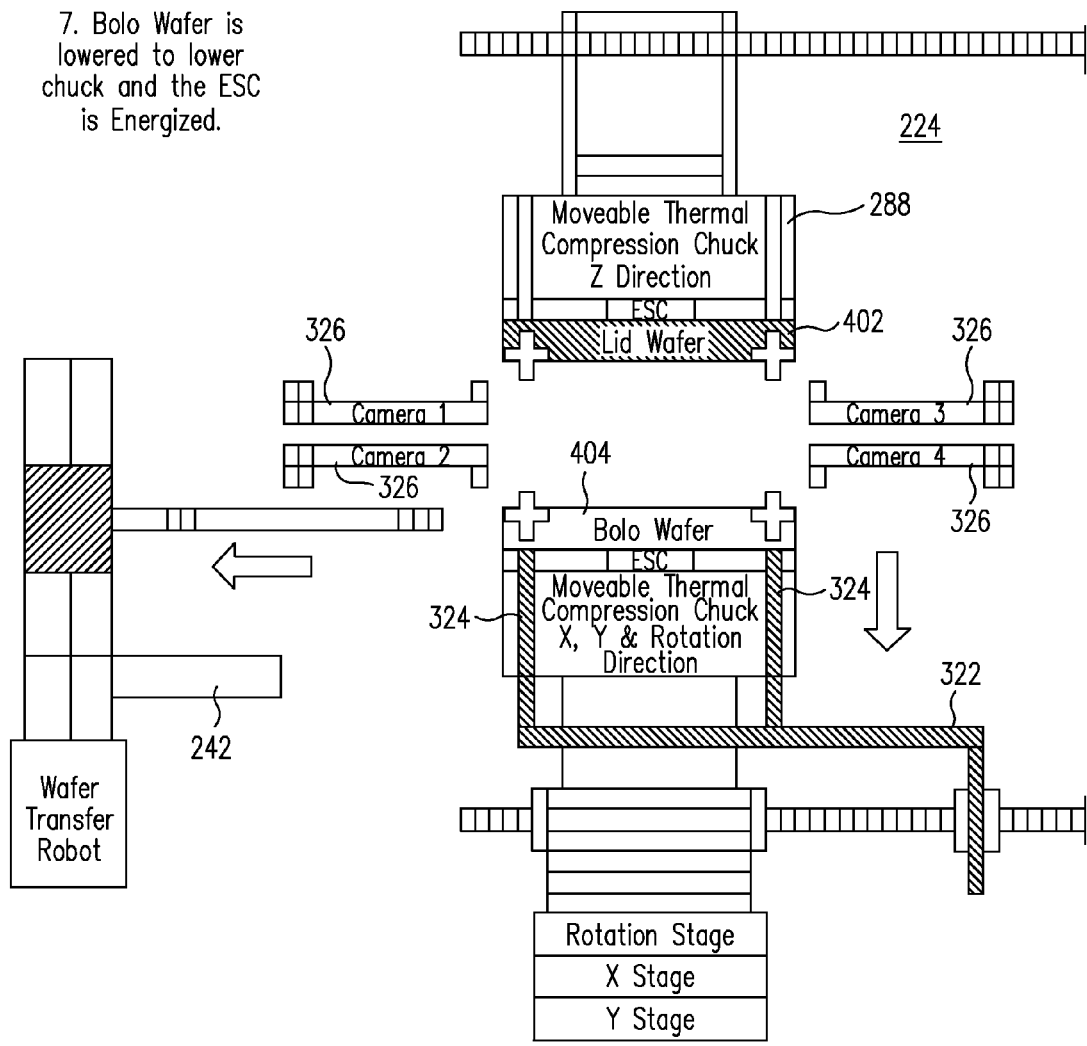

In FIG. 29, the push rod 322 is lowered, causing the lifting pins 324 to lower the bolometer wafer 404 onto the upper surface of the bolometer wafer chuck 290, and the chuck/ESC 290 is then energized so as to bind the wafer 404 to the chuck 290.

Figure 30:
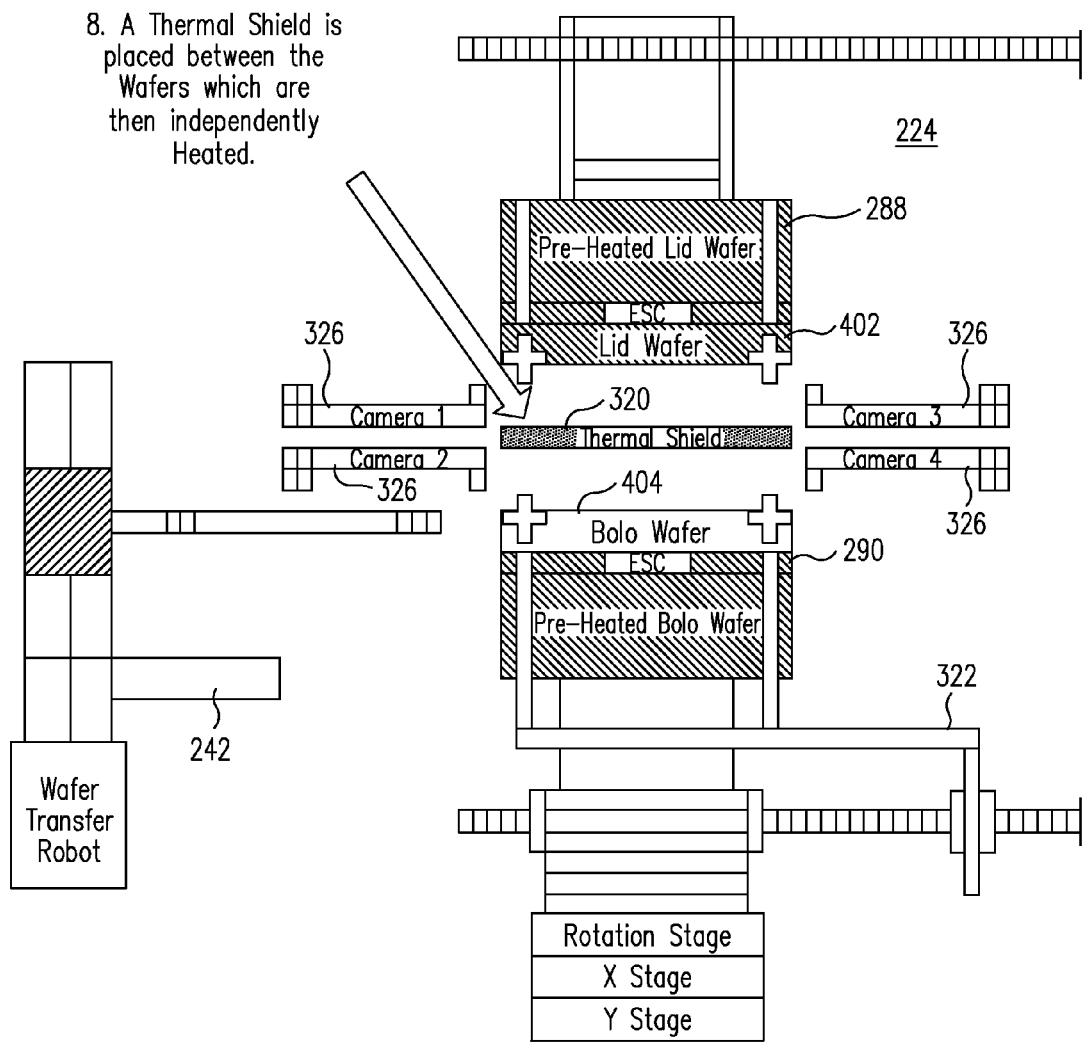

In FIG. 30, the thermal shield 320 is placed between the lid and bolometer wafers 402 and 404, which are then heated independently of each other using the respective heating mechanisms of the lid and bolometer wafer chucks 288 and 290 described above.

Figure 31:
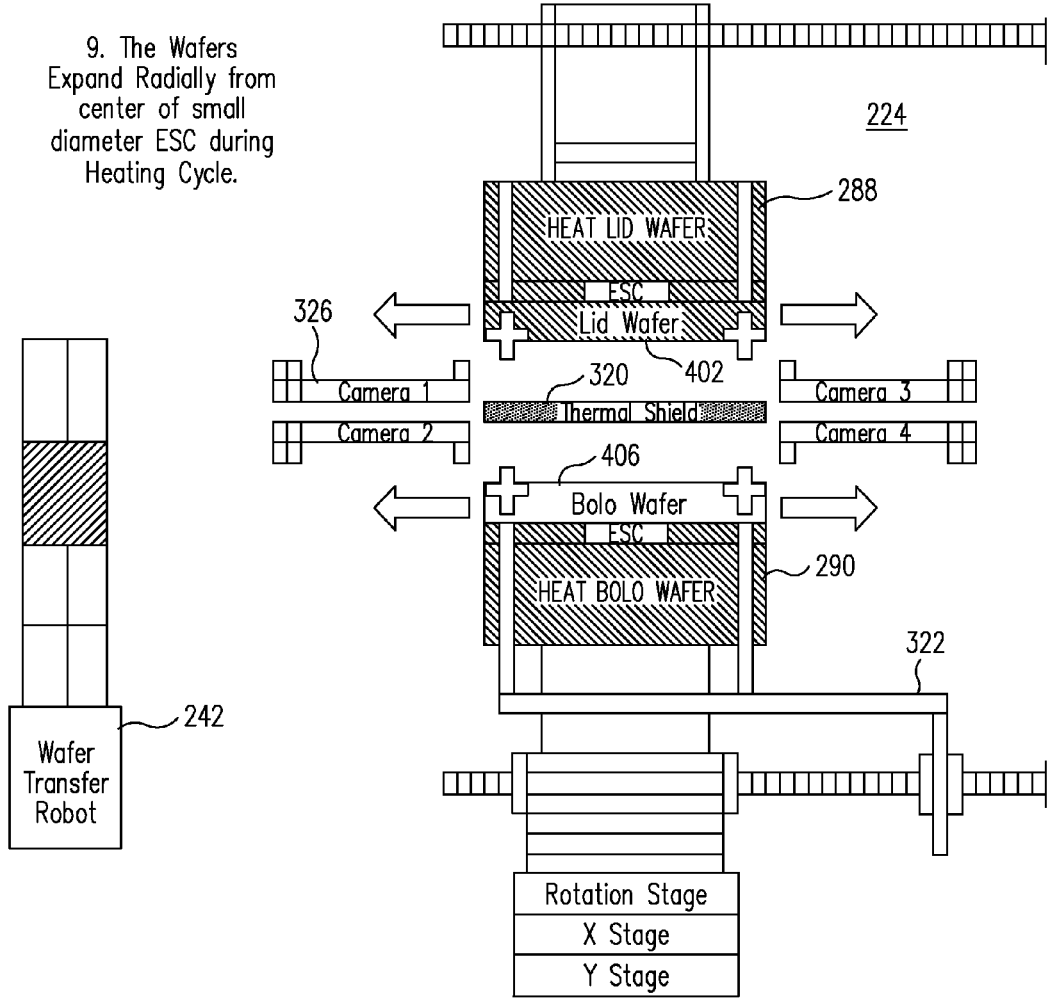

As illustrated in FIG. 31, during the independent heating of the lid and bolometer wafers 402 and 404, the wafers can expand radially from their respective centers by different amounts, as a function of their respective temperatures, indicating a need for a pre-bonding alignment of the two wafers when they are both disposed at about the same temperature.

Figure 32:
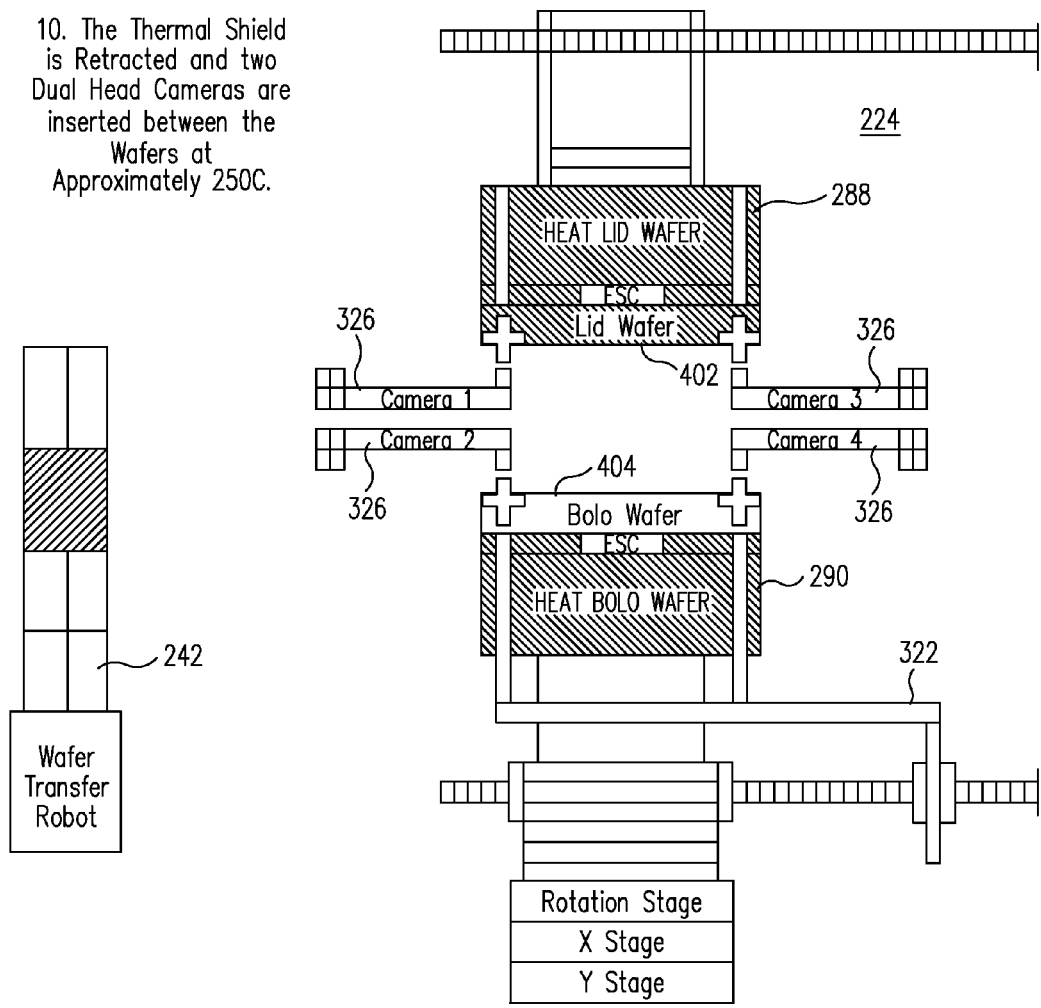

In FIG. 32, when the wafers 402 and 404 have reached approximate equilibrium, the thermal shield 320 is retracted from between the wafers and the two dual head cameras 326 are urged between the wafers for the purpose of aligning them.

Figure 33:
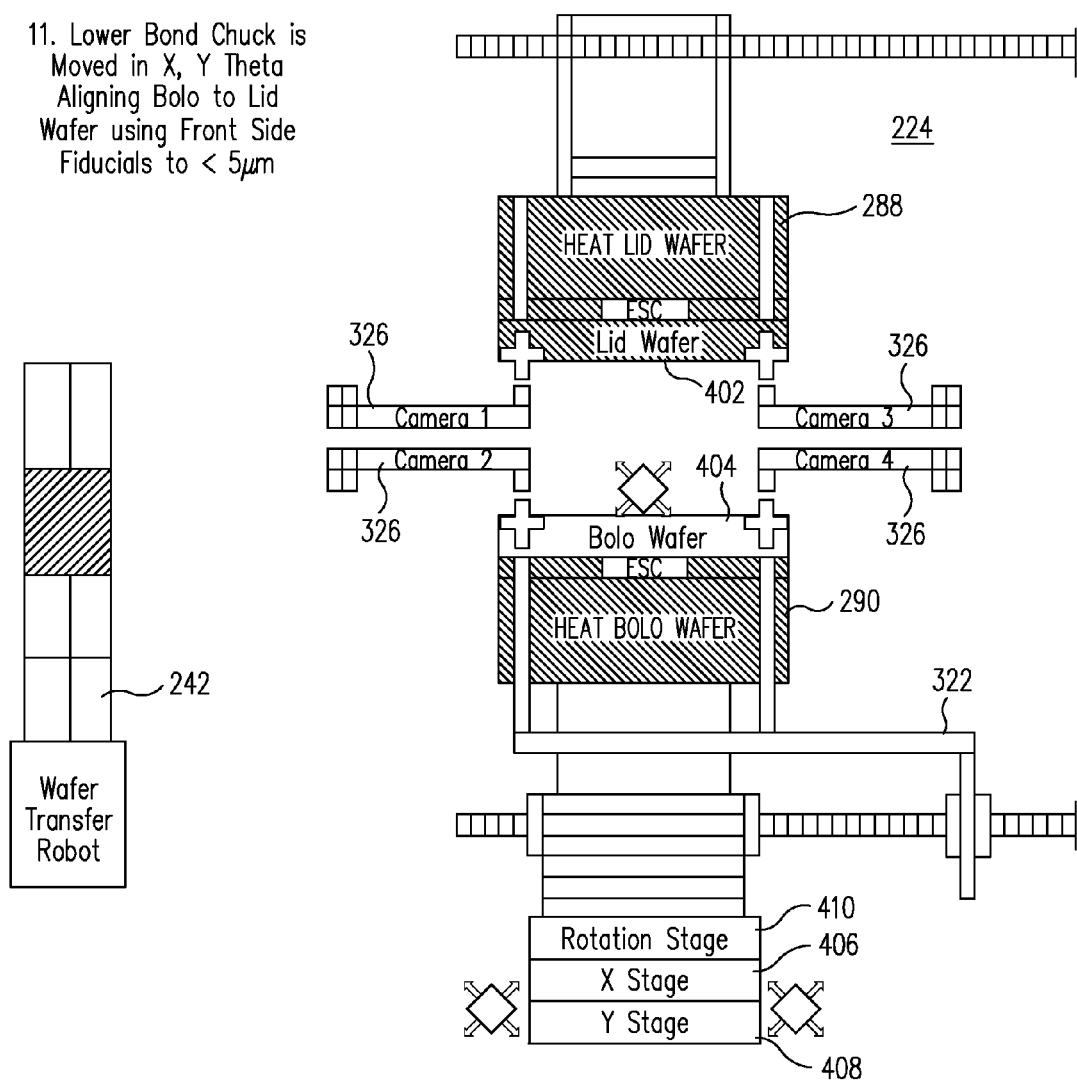

In FIG. 33, and using the dual head cameras 326 described above, the bolometer wafer chuck 290 is moved both in a horizontal direction, i.e., translationally along X and Y axes, and rotationally about a Z axis perpendicular to the X and Y axes, i.e., in a $\theta_z$ direction, until alignment fiducials located on respective ones of the opposing faces of the two wafers 402 and 404 are in alignment with each other to the desired accuracy. For this purpose, the bolometer wafer chuck 290 can be provided with three "stages" 406, 408 and 410 for moving the chuck 290 in each of the X, Y and $\theta_z$ directions, respectively.

Figure 34:
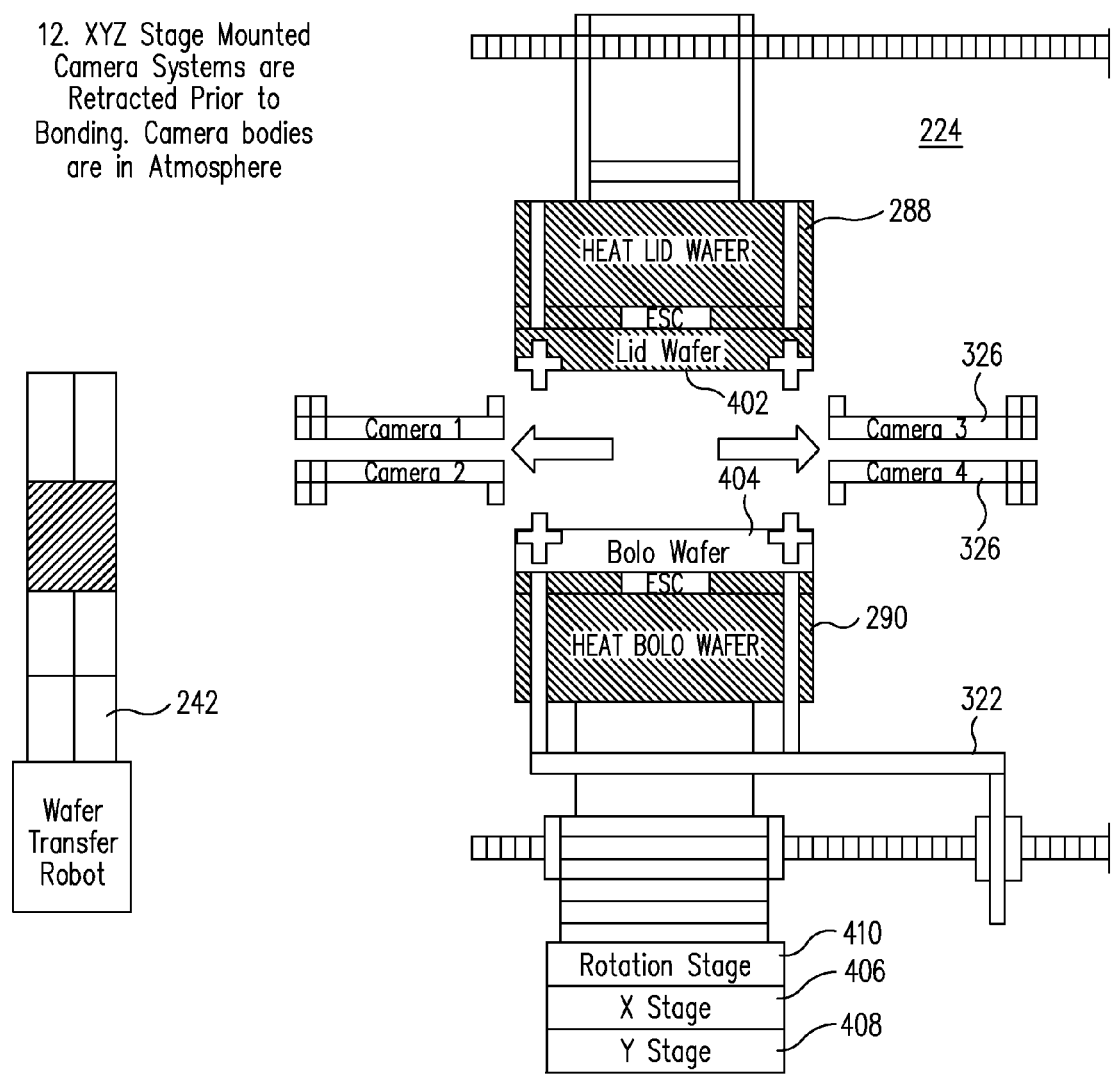

In FIG. 34, after alignment, the dual head cameras 326 are retracted from between the lid and bolometer wafers 402, 404.

Figure 35:
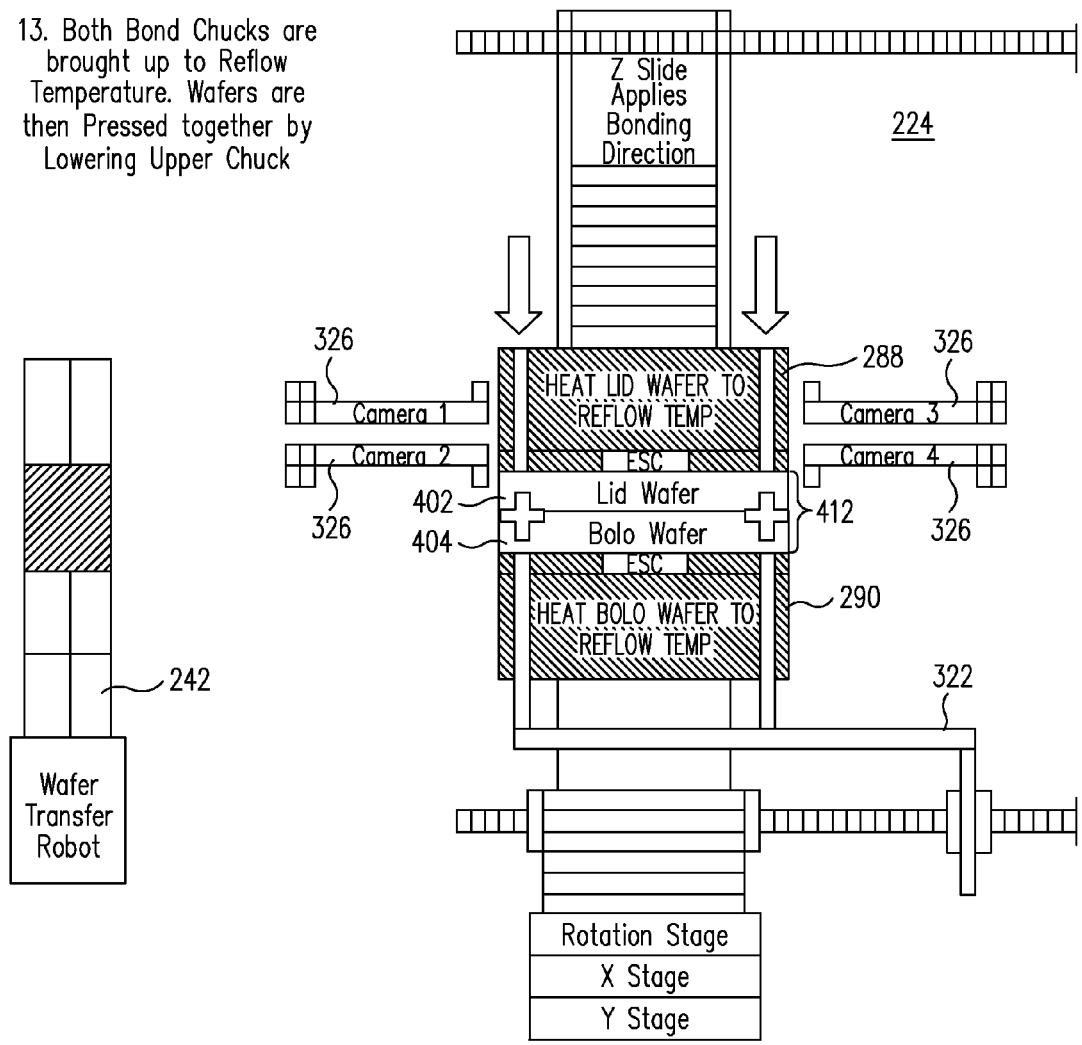

In FIG. 35, the respective temperature of both of the wafers 402, 404 are ramped up to a common bonding or reflow temperature using the heating mechanisms of the respective wafer chucks 288, 290, and the two wafers 402, 404 are then pressed together forcefully with a desired clamping force by lowering the lid wafer chuck 288 vertically toward the bolometer wafer chuck 290, such that the respective solder sealing rings on the wafers 402, 404 engage and reflow into each other, thereby forming a bonded wafer pair 412.

Figure 36:
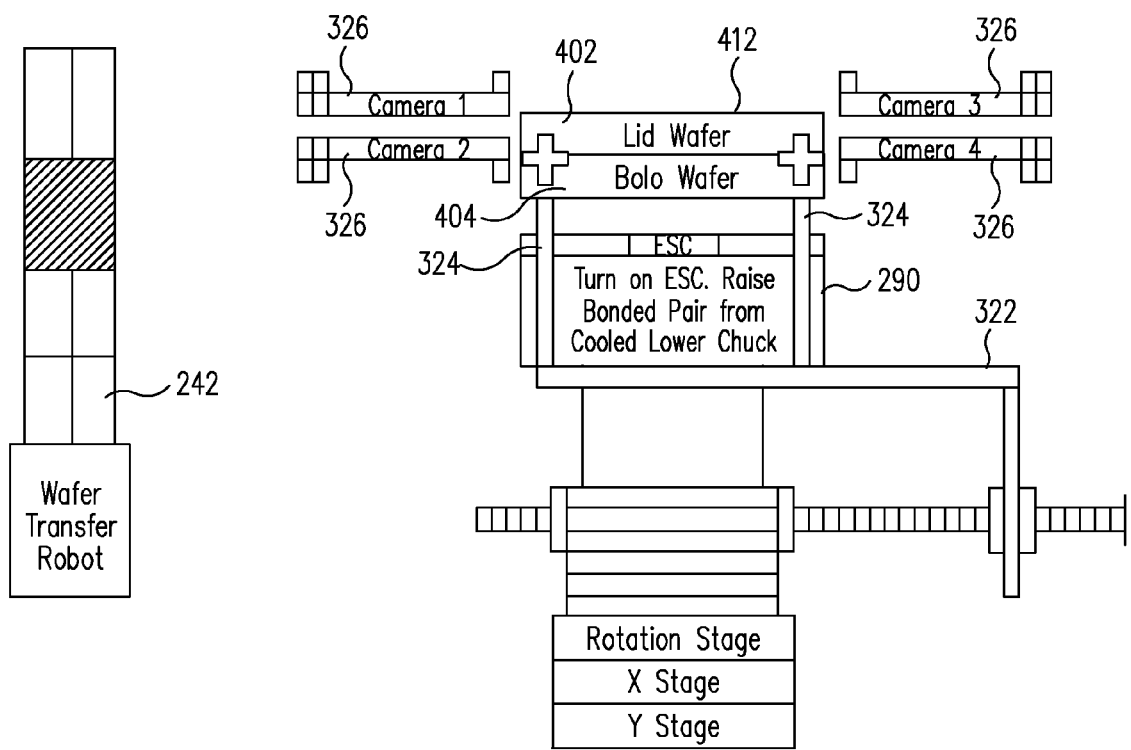

In FIG. 36, the wafer chucks 288, 290 are cooled down, for example, to a temperature below the reflow temperature of the solder sealing rings, using the chuck heating and cooling mechanism described above. The electrostatic charges on both chucks 288, 290 are then removed, thereby releasing their grip on the bonded wafer pair 412. The lid chuck 288 is raised above the bonded wafer pair 412, and the push rod 322 is raised up, causing the three lifting pins lifting pins 324 thereon to engage the lower surface of the wafer pair 412 and to lift it above the bolometer wafer chuck 290.

Figure 37:
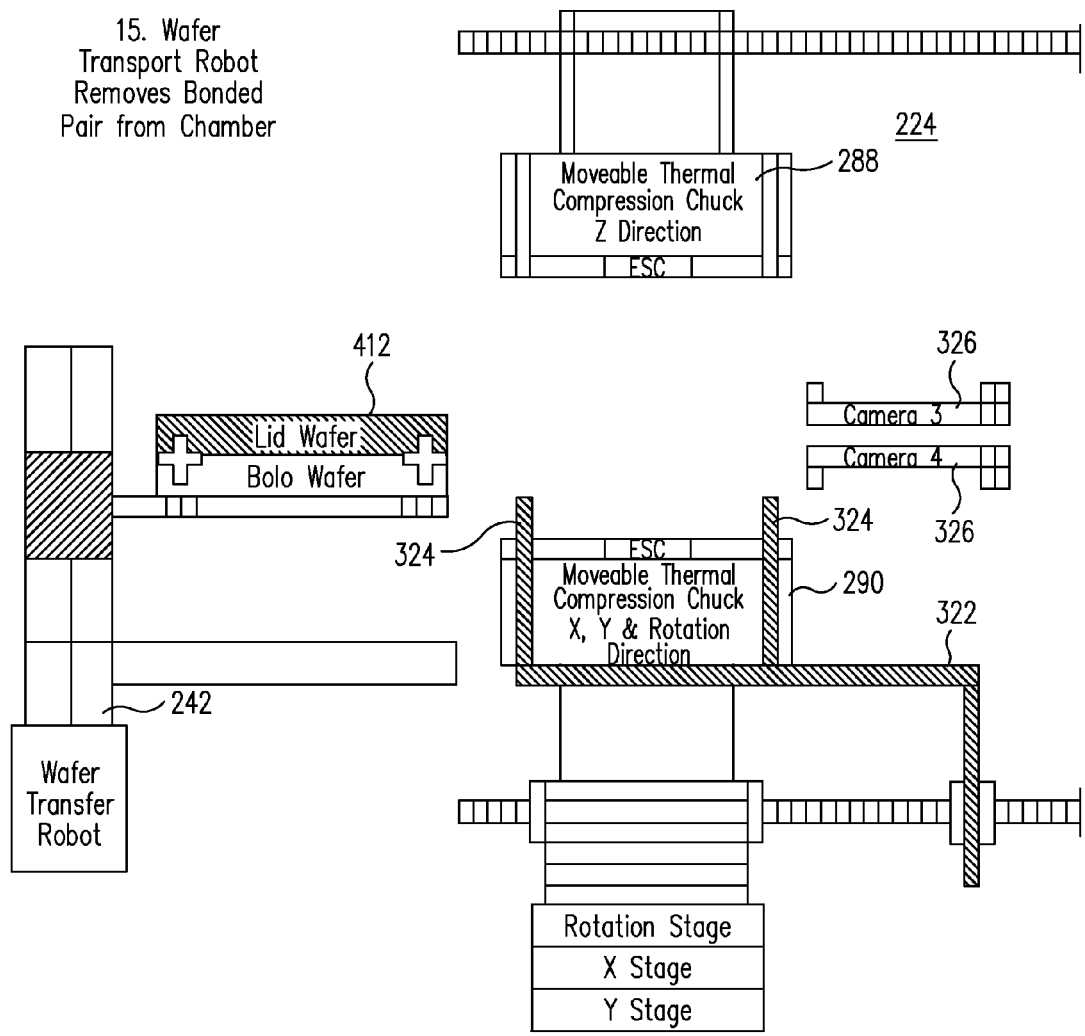

In FIG. 37, the wafer handling robot 242 of the central chamber 218 engages the elevated bonded wafer pair 412 and removes it from the alignment and bonding chamber 224, at which point it can be stored in one of the buffer modules 222 or transported back through the WLP apparatus 200 to a bonded wafer pair cassette in the OCA 204 of the EFEM 202, as described above.

For definitional purposes for one or more embodiments, Ultra-high vacuum (UHV) may be the vacuum regime characterized by pressures lower than about $10^{-7}$ pascal or 100 nanopascals ($10^{-9}$ mbar, ~$10^{-9}$ torr). As disclosed for one or more embodiments, UHV may require the use of unusual materials in construction and, in some embodiments, heating an entire system to 180° C. for several hours ("baking") to remove water and other trace gases which adsorb on the surfaces of the chamber. At these low pressures the mean free path of a gas molecule may be approximately 40 km, and so gas molecules will collide with the chamber walls many times before colliding with each other. Thus, almost all interactions take place on various surfaces of the system.

As those of some skill will appreciate, while the invention has been described in detail in connection with only a limited number of embodiments thereof, it should be readily understood that the invention is not limited to such disclosed embodiments. Rather, the methods and apparatus of the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention can include only some of the described embodiments. Accordingly, the invention is not to be seen as limited by the foregoing description, but is only limited by the scope of the appended claims and functional equivalents thereof.

What is claimed is:

1. A method comprising:
   providing a bolometer wafer;
   providing a lid wafer;
   pre-baking the bolometer wafer in at least a first ultra-high vacuum (UHV) environment in a first pre-baking module;
   pre-baking the lid wafer in at least a second UHV environment in a second pre-baking module different from the first pre-baking module, wherein the pre-baking the lid wafer in the second UHV environment comprises pre-baking at a different time, temperature, and/or vacuum profile than pre-baking the bolometer wafer in the first UHV environment;
   moving the bolometer wafer and lid wafer after the pre-baking to a UHV environment in a wafer alignment and bonding module;
   mounting the bolometer wafer on a bolometer wafer chuck;
   mounting the lid wafer on a lid wafer chuck and in facing opposition to the bolometer wafer;
   baking the bolometer wafer at a first temperature using the bolometer chuck;
   baking the lid wafer at a second temperature using the lid wafer chuck;
   raising the respective temperatures of the bolometer wafer and the lid wafer to a common bonding temperature using the bolometer and lid wafer chucks;
   clamping the bolometer wafer and the lid wafer together with a selected force, such that the wafers are bonded together in a bonded wafer pair; and
   lowering the temperature of the bonded wafer pair below the common bonding temperature, wherein a vacuum environment is maintained from the pre-baking of the bolometer and lid wafers through the lowering the temperature of the bonded wafer pair.

2. The method of claim 1, wherein the bolometer wafer is mounted on the bolometer wafer chuck via a first electrostatic clamp (ESC), the lid wafer is mounted on the lid wafer chuck via a second ESC, and the method provides for high volume manufacturing of microbolometer vacuum package assemblies.

3. The method of claim 1, further comprising aligning a fiducial on the bolometer wafer with a fiducial on the lid wafer, wherein the aligning the fiducial comprises operating a pair of dual head cameras to move between a position between the bolometer wafer chuck and the lid wafer chuck, and a position retracted from between the bolometer wafer chuck and the lid wafer chuck.

4. The method of claim 3, further comprising pre-aligning the bolometer wafer with the lid wafer before aligning the fiducial on the bolometer wafer with the fiducial on the lid wafer.

5. The method of claim 1, further comprising inspecting the alignment of the bolometer wafer with the lid wafer after the bonding.

6. The method of claim 1, wherein the baking comprises:
disposing a radiation shield between the bolometer wafer and the lid wafer;
baking the bolometer wafer at the first temperature for a first period of time; and
baking the lid wafer at the second temperature for a second period of time,
wherein the second temperature is less than the first temperature.

7. The method of claim 1, further comprising:
receiving at least one of the bolometer wafer or the lid wafer with an Equipment Front End Module (EFEM) at atmospheric pressure, wherein the providing of the bolometer and lid wafers comprises moving the bolometer and lid wafers from the EFEM to the vacuum environment; and
determining a position of the bolometer wafer and the lid wafer prior to the mounting of the bolometer wafer and the lid wafer.

8. The method of claim 1, wherein the pre-baking comprises:
baking the bolometer wafer at a first temperature for a first period of time in the first UHV environment; and
baking the lid wafer at a second temperature different than the first temperature for a second period of time in the second UHV environment.

9. The method of claim 1, further comprising storing at least one of the pre-baked bolometer and lid wafers in a UHV environment in a chamber separate from a chamber in which at least one of the pre-baked bolometer and/or lid wafers was pre-baked, wherein the vacuum environment is maintained during the pre-baking, the moving, and the storing.

10. The method of claim 1, wherein the UHV environments are environments with a pressure lower than approximately 100 nanopascals maintained by one or more cryogenic pumps, and wherein the providing the bolometer wafer to the mounting the bolometer wafer is via a first path and the providing the lid wafer to the mounting the lid wafer is via a second path.

* * * * *